United States Patent
Hirose et al.

(10) Patent No.: US 11,294,170 B2
(45) Date of Patent: Apr. 5, 2022

(54) METHOD FOR REMOVING FOREIGN MATTER AND METHOD FOR MANUFACTURING OPTICAL DETECTION DEVICE

(71) Applicant: HAMAMATSU PHOTONICS K.K., Hamamatsu (JP)

(72) Inventors: Masaki Hirose, Hamamatsu (JP); Katsumi Shibayama, Hamamatsu (JP); Takashi Kasahara, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 56 days.

(21) Appl. No.: 16/765,577

(22) PCT Filed: Nov. 9, 2018

(86) PCT No.: PCT/JP2018/041723
§ 371 (c)(1),
(2) Date: May 20, 2020

(87) PCT Pub. No.: WO2019/102876
PCT Pub. Date: May 31, 2019

(65) Prior Publication Data
US 2020/0310112 A1 Oct. 1, 2020

(30) Foreign Application Priority Data
Nov. 24, 2017 (JP) .............................. JP2017-226096

(51) Int. Cl.
*H01L 27/144* (2006.01)
*H01L 31/0203* (2014.01)
(Continued)

(52) U.S. Cl.
CPC ............ *G02B 27/0006* (2013.01); *B08B 5/02* (2013.01); *B08B 13/00* (2013.01);
(Continued)

(58) Field of Classification Search
CPC .... G02B 27/0006; G02B 5/284; G02B 26/00; G02B 26/001; G02B 5/28; B08B 5/02;
(Continued)

(56) References Cited

U.S. PATENT DOCUMENTS 6,327,021 B1  12/2001  Higashiguchi
2007/0182957 A1  8/2007  Zama et al.
(Continued)

FOREIGN PATENT DOCUMENTS

CN   1737664 A    2/2006
CN   105683725 A  6/2016
(Continued)

OTHER PUBLICATIONS

International Preliminary Report on Patentability dated Jun. 4, 2020 ffor PCT/JP2018/041723.
(Continued)

*Primary Examiner* — Duy T Nguyen
(74) *Attorney, Agent, or Firm* — Faegre Drinker Biddle & Reath LLP

(57) ABSTRACT

A method for removing a foreign substance according to an embodiment includes: a step of preparing a Fabry-Perot interference filter in which a gap is formed between a portion of a first laminate at least including a first mirror portion and a portion of a second laminate at least including a second mirror portion facing each other so that a distance between the first mirror portion and the second mirror portion facing each other varies by an electrostatic force; a step of detecting a foreign substance adhering to a surface of the second laminate; and a step of blowing air in which an airflow peak
(Continued)

position is adjusted on the basis of a position of the detected foreign substance onto the surface of the second laminate and thereby removing the foreign substance from the surface of the second laminate.

8 Claims, 24 Drawing Sheets

(51) Int. Cl.

| | |
|---|---|
| H01L 31/0216 | (2014.01) |
| H01L 31/18 | (2006.01) |
| G02B 27/00 | (2006.01) |
| B08B 5/02 | (2006.01) |
| B08B 13/00 | (2006.01) |
| G02B 5/28 | (2006.01) |

(52) U.S. Cl.
CPC ...... *H01L 27/1446* (2013.01); *H01L 31/0203* (2013.01); *H01L 31/02165* (2013.01); *H01L 31/18* (2013.01); *G02B 5/284* (2013.01)

(58) Field of Classification Search
CPC . B08B 13/00; H01L 27/1446; H01L 31/0203; H01L 31/02165; H01L 31/18; B81C 3/00; B81C 99/00; G01J 3/26; G01N 21/88
USPC ........................................................... 438/65
See application file for complete search history.

(56) References Cited

U.S. PATENT DOCUMENTS

| | | | |
|---|---|---|---|
| 2008/0290479 A1 | 11/2008 | Hong et al. | |
| 2008/0297782 A1* | 12/2008 | Zama | ................. G01N 21/9501 356/237.4 |
| 2012/0050751 A1* | 3/2012 | Blomberg | ............ G02B 26/001 356/519 |
| 2013/0335748 A1* | 12/2013 | Tanemura | .......... G01B 9/02023 356/519 |
| 2014/0007371 A1 | 1/2014 | Lu et al. | |
| 2015/0042362 A1* | 2/2015 | Shinto | ...................... G01B 7/14 324/662 |
| 2015/0311664 A1 | 10/2015 | Bulovic et al. | |
| 2016/0245697 A1* | 8/2016 | Shibayama | ............ G01J 3/0286 |
| 2016/0357009 A1* | 12/2016 | Shibayama | ................ G01J 3/26 |
| 2018/0292267 A1* | 10/2018 | Hirose | .............. H01L 31/02005 |

FOREIGN PATENT DOCUMENTS

| | | |
|---|---|---|
| CN | 105992964 A | 10/2016 |
| DE | 102010040370 | 10/2016 |
| EP | 3106910 A1 | 12/2016 |
| JP | H11-344361 A | 12/1999 |
| JP | 2002-174721 A | 6/2002 |
| JP | 2003-194736 A | 7/2003 |
| JP | 2005-228863 | 8/2005 |
| JP | 2007-049021 A | 2/2007 |
| JP | 2012-150350 | 8/2012 |
| JP | 2012-248888 A | 12/2012 |
| JP | 2013-506154 A | 2/2013 |
| JP | 2014-202481 A | 10/2014 |
| JP | 2015-031942 A | 2/2015 |
| JP | 2015-518646 A | 7/2015 |
| JP | 2015-152713 A | 8/2015 |
| JP | 2016-211860 | 12/2016 |
| WO | WO-2011/036346 A1 | 3/2011 |
| WO | WO-2013/138286 A1 | 9/2013 |
| WO | WO-2017/204326 A1 | 11/2017 |

OTHER PUBLICATIONS

S. L. Mielke et al., "Measurements of the phase shift on reflection for low-order infrared Fabry-Perot interferometer dielectric stack mirrors", Applied Optics, vol. 36, No. 31, Nov. 2, 1997, p. 8139, XP055491665.

* cited by examiner

METHOD FOR REMOVING FOREIGN MATTER AND METHOD FOR MANUFACTURING OPTICAL DETECTION DEVICE

CROSS-REFERENCE TO RELATED APPLICATIONS

This application is 371 of International Patent Application No. PCT/JP2018/041723, filed Nov. 9, 2018, which claims the benefit of priority to Japanese Patent Application No. 2017-226096, filed Nov. 24, 2017, the contents of each of which is incorporated herein by reference.

TECHNICAL FIELD

The present disclosure relates to a method for removing a foreign substance adhering to a Fabry-Perot interference filter, and a method for manufacturing a light detection device.

BACKGROUND ART

In the related art, a Fabry-Perot interference filter including a substrate, a fixed mirror and a movable mirror facing each other via a gap on the substrate is known (for example, refer to Patent Literature 1).

CITATION LIST

Patent Literature

Patent Literature 1: Japanese Unexamined Patent Publication No. 2013-506154

SUMMARY OF INVENTION

Technical Problem

Since a Fabry-Perot interference filter has a relatively fragile movable mirror in a membrane shape, basically no attempt has been made to remove a foreign substance by a method that might cause deformation or breakage of the movable mirror. For this reason, the Fabry-Perot interference filter just having a foreign substance adhering to its surface has been treated as a faulty product in some cases, hindering improvement of the yield.

In view of this, the present disclosure aims to provide a method for removing a foreign substance and a method for manufacturing a light detection device capable of effectively removing a foreign substance adhering to a Fabry-Perot interference filter and improving a yield.

Solution to Problem

A method for removing a foreign substance according to an aspect of the present disclosure includes: a step of preparing a Fabry-Perot interference filter including a substrate having a first surface and a second surface opposite to the first surface, a first laminate having a first mirror portion arranged on the first surface, and a second laminate having a second mirror portion arranged on the first mirror portion, in which a gap is formed between a portion of the first laminate at least including the first mirror portion and a portion of the second laminate at least including the second mirror portion facing each other so that a distance between the first mirror portion and the second mirror portion facing each other varies by an electrostatic force; a step of detecting a foreign substance adhering to a surface of the second laminate opposite to the first laminate; and a step of blowing air in which an airflow peak position is adjusted on the basis of the position of the detected foreign substance onto the surface of the second laminate and thereby removing the foreign substance from the surface of the second laminate.

With the application of the method for removing a foreign substance according to one aspect of the present disclosure, a foreign substance adhering to the surface of the second laminate of a Fabry-Perot interference filter can be detected, and the foreign substance can be removed by blowing air. Since the airflow peak position of the air is adjusted on the basis of the position of the detected foreign substance, the foreign substance can be appropriately removed by blowing the air. As described above, according to the above-described method for removing a foreign substance, the foreign substance adhering to the Fabry-Perot interference filter can be effectively removed, and the Fabry-Perot interference filter can be obtained with high yield.

Here, the Fabry-Perot interference filter has a gap formed between a portion of the first laminate at least including the first mirror portion and a portion of the second laminate at least including the second mirror portion facing each other. That is, the portion of the second laminate overlapping the gap when viewed in the direction in which the first mirror portion and the second mirror portion face each other (hereinafter, simply referred to as a "membrane portion") has a membrane structure, which makes this portion relatively vulnerable. This has discouraged attempts to remove a foreign substance using a method involving generation of a stress to be a load on the membrane portion and involving a concern of deformation or breakage in the membrane portion, and therefore, a Fabry-Perot interference filter to which a foreign substance adheres has often been treated as a faulty product. However, as a result of earnest and intensive research by the present inventors, it is confirmed that a method using air blow is capable of removing a foreign substance without affecting the characteristics of the Fabry-Perot interference filter even though this is a method of generating stress in the membrane portion.

In the step of removing a foreign substance, the airflow peak position may be adjusted to match the position of the foreign substance. In this case, since an airflow peak (that is, a portion where the air velocity is highest) directly hits the foreign substance, the foreign substance can be further reliably removed.

A plurality of through-holes may be formed from the surface of the second laminate to the gap, in a portion of the second laminate overlapping the gap when viewed in a direction in which the first mirror portion and the second mirror portion face each other, and the air may be blown onto at least a region of the surface of the second laminate where a plurality of through-holes is formed, in the step of removing a foreign substance. In this case, the air blown to the surface of the second laminate can be introduced into the gap via the plurality of through-holes. The air that has entered the gap is pushed out by air that newly enters the gap, so as to be discharged toward the surface of the second laminate via a through-hole that is different from the through-hole used as a passage of the air that newly enters the gap. In this manner, the foreign substance adhering to the surface of the second laminate can be blown up by the air discharged to the outside from the gap. This makes it possible to further effectively remove the foreign substance adhering to the Fabry-Perot interference filter.

In the step of preparing a Fabry-Perot interference filter, a wafer having a plurality of Fabry-Perot interference filters two-dimensionally linked to each other is prepared, and the step of detecting a foreign substance and the step of removing a foreign substance may be performed on the Fabry-Perot interference filter constituting the wafer. In this case, in a case where a foreign substance adheres to the Fabry-Perot interference filter constituting the wafer, the foreign substance can be removed by blowing air. With this configuration, in a case of inspecting each of a plurality of Fabry-Perot interference filters constituting a wafer, it is possible to transfer the Fabry-Perot interference filter from which a foreign substance has been removed to a subsequent process as a non-faulty product without immediately making a determination of faulty on the Fabry-Perot interference filter to which a foreign substance has adhered. Therefore, it is possible to improve the yield of the Fabry-Perot interference filter.

In the step of preparing a Fabry-Perot interference filter, singulated Fabry-Perot interference filters may be prepared. For example, in a case where foreign substance removal is performed by blowing air on a Fabry-Perot interference filter constituting a wafer including a plurality of Fabry-Perot interference filters, the foreign substance might scatter onto other Fabry-Perot interference filters constituting the wafer and might adversely affect the other Fabry-Perot interference filters. In contrast, by removing a foreign substance using air blow onto the Fabry-Perot interference filter at a stage where the Fabry-Perot interference filter is singulated as described above, it is possible to prevent occurrence of adverse effects to the other Fabry-Perot interference filters as described above.

A method for manufacturing a light detection device according to an aspect of the present disclosure is a method for manufacturing a light detection device including: a package having a cap formed with an opening through which light is incident and having a stein joined to the cap; a Fabry-Perot interference filter disposed in the package; and a light detector arranged in the package so as to detect light transmitted through the Fabry-Perot interference filter. The Fabry-Perot interference filter includes: a substrate having a first surface and a second surface opposite to the first surface; a first laminate having a first mirror portion arranged on the first surface; and a second laminate having a second mirror portion arranged on the first mirror portion, in which a gap is formed between a portion of the first laminate at least including the first mirror portion and a portion of the second laminate at least including the second mirror portion facing each other so that a distance between the first mirror portion and the second mirror portion facing each other varies by an electrostatic force. The manufacturing method includes: a step of preparing a stein to which the Fabry-Perot interference filter and the light detector are secured; a step of detecting a foreign substance adhering to a surface of the second laminate opposite to the first laminate of the Fabry-Perot interference filter secured to the stein; a step of blowing air in which an airflow peak position is adjusted on the basis of the position of the detected foreign substance onto the surface of the second laminate and thereby removing the foreign substance from the surface of the second laminate; and a step of joining the cap to the stein after the step of removing a foreign substance.

According to the method for manufacturing a light detection device, it is possible to detect a foreign substance adhering to the surface of the second laminate of the Fabry-Perot interference filter and possible to remove the foreign substance by air blow in a state where the Fabry-Perot interference filter and the light detector are secured to the stein. That is, it is possible to appropriately detect and remove foreign substance adhering to the Fabry-Perot interference filter immediately before acquisition of the light detection device. Here, since the assembling work of the light detection device is not always performed in a cleanroom with high cleanliness, the possibility of adhesion of a foreign substance to a surface of the Fabry-Perot interference filter during the assembling work can be relatively high. According to the above-described manufacturing method, it is possible to remove the foreign substance adhering to the Fabry-Perot interference filter in the final stage of the manufacturing process of the light detection device without significantly affecting the characteristics of the Fabry-Perot interference filter. This enables improvement of the yield of the light detection device, which is the final product, making it possible to obtain the light detection device with high yield.

A method for manufacturing a light detection device according to another aspect of the present disclosure is a method for manufacturing a light detection device including: a package having a lid substrate and a support body joined to the lid substrate; a Fabry-Perot interference filter disposed in the package; and a light detector disposed in the package so as to detect light transmitted through the Fabry-Perot interference filter. The Fabry-Perot interference filter includes: a substrate having a first surface and a second surface opposite to the first surface; a first laminate having a first mirror portion arranged on the first surface; and a second laminate having a second mirror portion arranged on the first mirror portion, in which a gap is formed between a portion of the first laminate at least including the first mirror portion and a portion of the second laminate at least including the second mirror portion facing each other so that a distance between the first mirror portion and the second mirror portion facing each other varies by an electrostatic force. The manufacturing method includes: a step of preparing a plurality of Fabry-Perot interference filters arranged one-dimensionally or two-dimensionally, a plurality of light detectors provided corresponding to the plurality of Fabry-Perot interference filters, and a support layer that is to support the plurality of Fabry-Perot interference filters and the plurality of light detectors and that is to be cut into a plurality of support bodies; a step of detecting a foreign substance adhering to a surface of the second laminate opposite to the first laminate for each of the plurality of Fabry-Perot interference filters; a step of blowing air in which an airflow peak position is adjusted on the basis of the position of the detected foreign substance onto the surface of the second laminate and thereby removing the foreign substance from the surface of the second laminate; a step of joining a lid substrate layer that is to be cut into a plurality of the lid substrates to the support layer after the step of removing a foreign substance and thereby obtaining a plurality of the light detection devices one-dimensionally or two-dimensionally linked to each other; and a step of cutting a portion at which the lid substrate layer and the support layer are joined and thereby obtaining each of the light detection devices.

According to the method for manufacturing a light detection device, it is possible to detect a foreign substance adhering to the surface of the second laminate of each of the Fabry-Perot interference filters and possible to remove the foreign substance by air blow in a state where a plurality of the Fabry-Perot interference filters is supported by the support layer. That is, it is possible to appropriately detect and remove foreign substance adhering to each of the Fabry-Perot interference filters immediately before acquisition of the light detection device. Therefore, according to the present manufacturing method, the effects similar to those of the above-described method for manufacturing a light detection device.

In the step of obtaining a plurality of light detection devices, the lid substrate layer having a plurality of openings formed in advance may be joined to the support layer such that each of the plurality of openings faces each of the plurality of Fabry-Perot interference filters. In this case, by using a lid substrate layer having a plurality of openings formed in advance, it is possible to obtain a light detection device having an opening for allowing incidence of light formed in the lid substrate immediately after cutting the lid substrate layer and the support layer. This makes it possible to omit a step for forming an opening in the lid substrate of each of the light detection devices after the cutting.

Advantageous Effects of Invention

According to the present disclosure, it is possible to provide a method for removing a foreign substance and a method for manufacturing a light detection device capable of effectively removing a foreign substance adhering to a Fabry-Perot interference filter and improving a yield.

DESCRIPTION OF EMBODIMENTS

Figure 1:
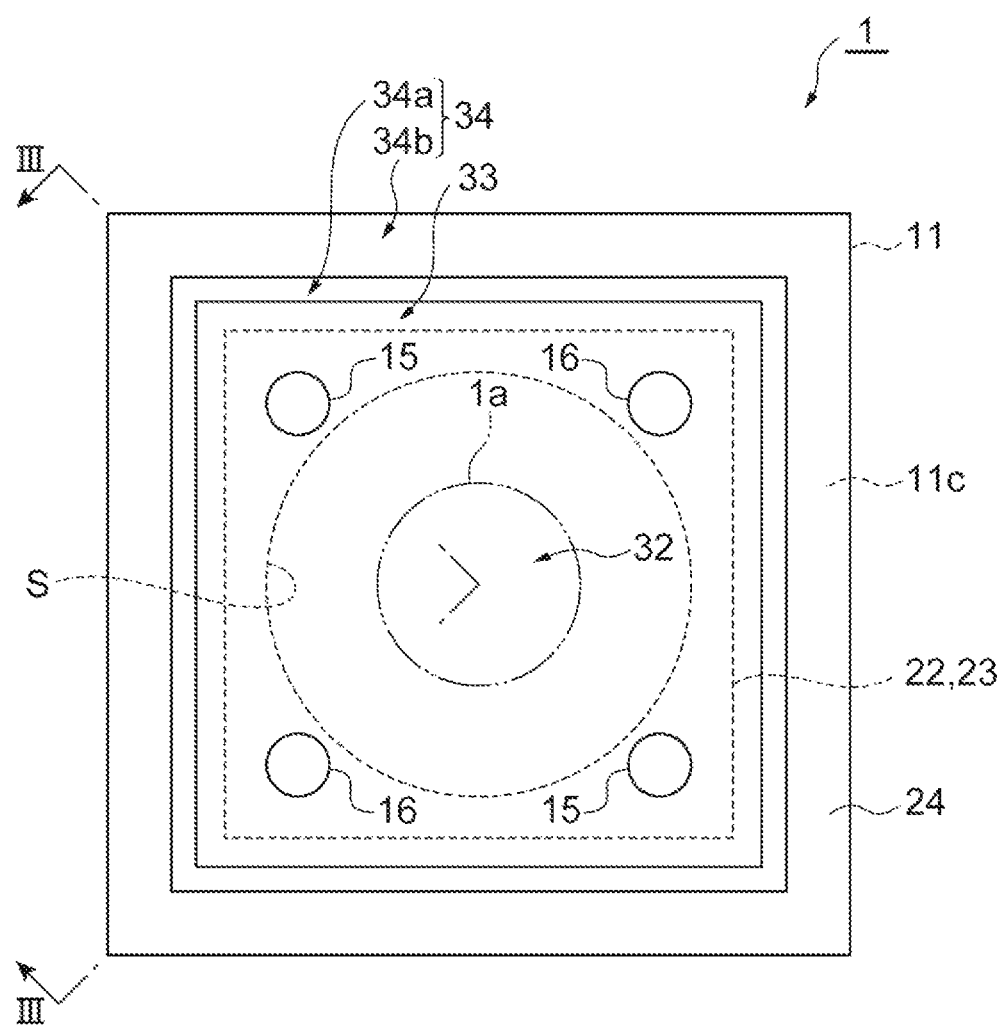
FIG. 1 is a plan view of a Fabry-Perot interference filter cut out from a wafer according to an embodiment.

Hereinafter, an embodiment of the present disclosure will be described in detail with reference to the drawings. In all the drawings, the same or equivalent portions are denoted with the same reference numerals and duplicated description is omitted.

[Configuration of Fabry-Perot Interference Filter and Dummy Filter]

Prior to the description of a method for removing a foreign substance and a method for manufacturing a light detection device according to an embodiment, configurations of a Fabry-Perot interference filter and a dummy filter cut out from a wafer will be described.

Figure 2:
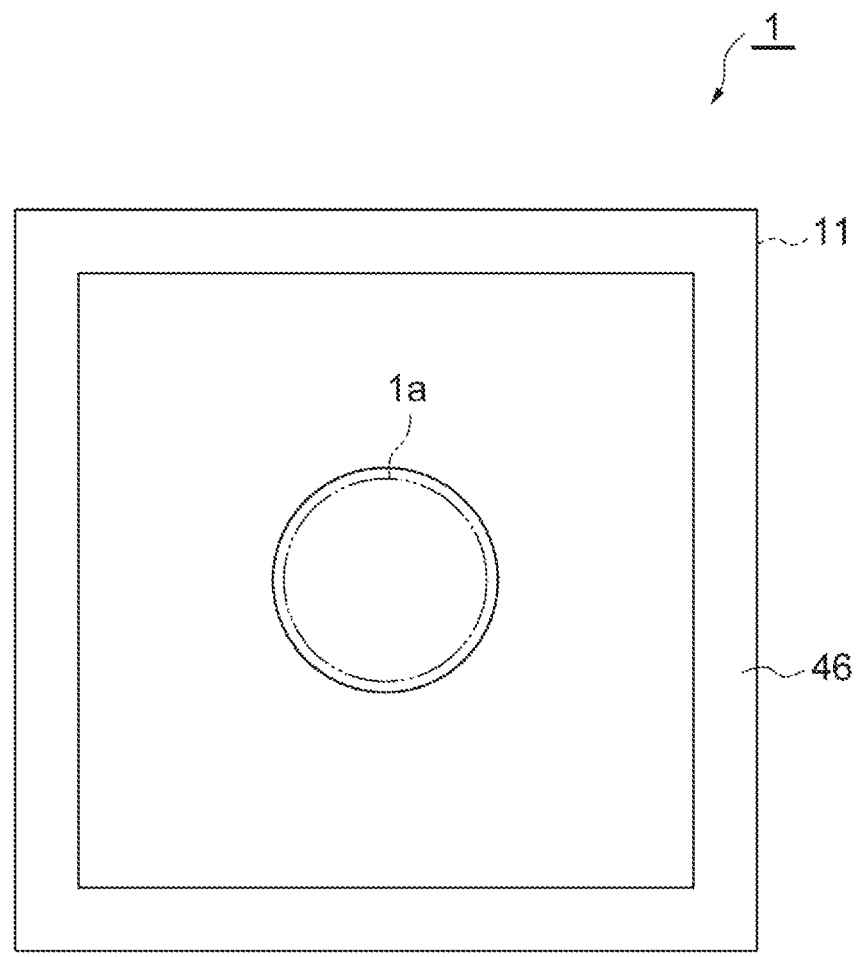
FIG. 2 is a bottom view of the Fabry-Perot interference filter illustrated in FIG. 1.
Figure 3:
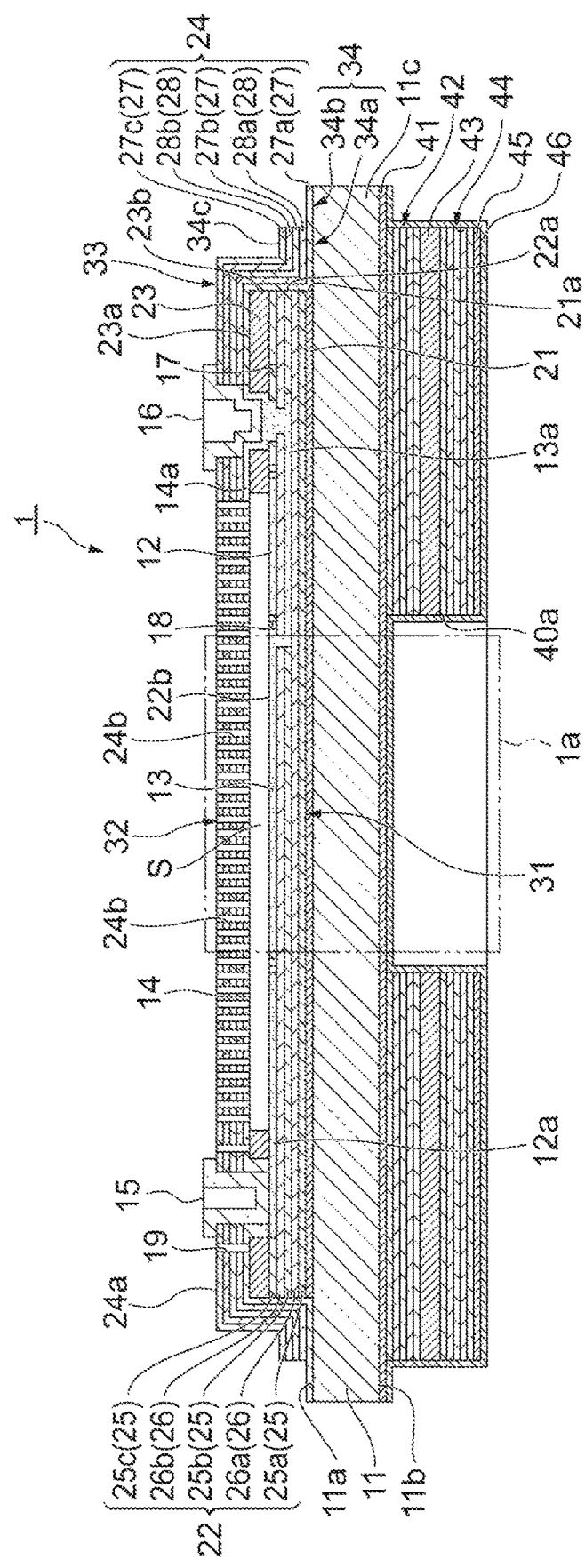
FIG. 3 is a cross-sectional view of the Fabry-Perot interference filter taken along line III-III in FIG. 1.

As illustrated in FIGS. 1, 2, and 3, a Fabry-Perot interference filter 1 includes a substrate 11. The substrate 11 has a first surface 11a and a second surface 11b opposite to the first surface 11a. On the first surface 11a, a reflection prevention layer 21, a first laminate 22, an intermediate layer 23, and a second laminate 24 are laminated in this order. A gap (air gap) S is defined between the first laminate 22 and the second laminate 24 by the frame-shaped intermediate layer 23.

The shape and the positional relationship of each of portions when viewed in a direction perpendicular to the first surface 11a (plan view) are as follows. For example, an outer edge of the substrate 11 has a rectangular shape. The outer edge of the substrate 11 and an outer edge of the second laminate 24 are aligned with each other. An outer edge of the reflection prevention layer 21, an outer edge of the first laminate 22, and an outer edge of the intermediate layer 23 are aligned with each other. The substrate 11 has an outer edge portion 11c positioned on an outer side of the outer edge of the intermediate layer 23 with respect to the center of the gap S. For example, the outer edge portion 11c has a frame shape and surrounds the intermediate layer 23 when viewed in a direction perpendicular to the first surface 11a. The gap S has a circular shape, for example.

The Fabry-Perot interference filter 1 transmits light having a predetermined wavelength through a light transmission region 1a defined in a center portion of the Fabry-Perot interference filter 1. For example, the light transmission region 1a is a columnar region. The substrate 11 is formed of silicon, quartz, or glass, for example. When the substrate 11 is formed of silicon, the reflection prevention layer 21 and the intermediate layer 23 are formed of silicon oxide, for example. The thickness of the intermediate layer 23 ranges from several tens of nm to several tens of μm, for example.

A portion corresponding to the light transmission region 1a in the first laminate 22 functions as a first mirror portion 31. The first mirror portion 31 is a fixed mirror. The first mirror portion 31 is disposed on the first surface 11a via the reflection prevention layer 21. The first laminate 22 includes alternate laminations of each of a plurality of polysilicon layers 25 and each of a plurality of silicon nitride layers 26. The Fabry-Perot interference filter 1 includes layers of a polysilicon layer 25a, a silicon nitride layer 26a, a polysilicon layer 25b, a silicon nitride layer 26b, and a polysilicon layer 25c laminated on the reflection prevention layer 21 in this order. The optical thickness of each of the polysilicon layers 25 and the silicon nitride layers 26 included in the first mirror portion 31 is preferably an integral multiple of ¼ of a center transmission wavelength. The first mirror portion 31 may be directly disposed on the first surface 11a without interposing the reflection prevention layer 21.

The portion corresponding to the light transmission region 1a in the second laminate 24 functions as a second mirror portion 32. The second mirror portion 32 is a movable mirror. The second mirror portion 32 faces the first mirror portion 31 via the gap S on a side opposite to the substrate 11 with respect to the first mirror portion 31. The direction in which the first mirror portion 31 and the second mirror portion 32 face each other is parallel to a direction perpendicular to the first surface 11a. The second laminate 24 is disposed on the first surface 11a via the reflection prevention layer 21, the first laminate 22, and the intermediate layer 23. The second laminate 24 includes alternate laminations of each of the plurality of polysilicon layers 27 and each of the plurality of silicon nitride layers 28. The Fabry-Perot interference filter 1 includes layers of a polysilicon layer 27a, a silicon nitride layer 28a, a polysilicon layer 27b, a silicon nitride layer 28b, and a polysilicon layer 27c laminated on the intermediate layer 23 in this order. The optical thickness of each of the polysilicon layer 27 and the silicon nitride layer 28 included in the second mirror portion 32 is preferably an integral multiple of ¼ of the center transmission wavelength.

In the first laminate 22 and the second laminate 24, silicon oxide layers may be used in place of the silicon nitride layers. In addition, examples of the material applicable for each of layers forming the first laminate 22 and the second laminate 24 include titanium oxide, tantalum oxide, zirconium oxide, magnesium fluoride, aluminum oxide, calcium fluoride, silicon, germanium, zinc sulfide, or the like. Here, the surface of the first mirror portion 31 on the gap S side (surface of the polysilicon layer 25c) and the surface of the second mirror portion 32 on the gap S side (surface of the polysilicon layer 27a) directly face each other via the gap S. Note that an electrode layer, a protective layer, or the like (not forming a mirror) may be formed on the surface of the first mirror portion 31 on the gap S side and on the surface of the second mirror portion 32 on the gap S side. In this case, the first mirror portion 31 and the second mirror portion 32 face each other via the gap S with the presence of these interposed layers. In other words, even in such a case, a facing configuration between the first mirror portion 31 and the second mirror portion 32 via the gap S can be achieved.

A plurality of through-holes 24b is formed at a portion of the second laminate 24 corresponding to the gap S (a portion overlapping the gap S when viewed in a direction perpendicular to the first surface 11a). Each of the through-holes 24b extends to reach the gap S from a surface 24a of the second laminate 24 opposite to the intermediate layer 23. The plurality of through-holes 24b is formed so as not to substantially influence the function of the second mirror portion 32. The plurality of through-holes 24b is used for forming the gap S by removing a portion of the intermediate layer 23 through etching.

In addition to the second mirror portion 32, the second laminate 24 further includes a covering portion 33 and a peripheral edge portion 34. The second mirror portion 32, the covering portion 33, and the peripheral edge portion 34 are integrally formed to have a portion of a same laminated structure and to be continuous to each other. The covering portion 33 surrounds the second mirror portion 32 when viewed in a direction perpendicular to the first surface 11a. The covering portion 33 covers a surface 23a of the intermediate layer 23 on a side opposite to the substrate 11, a side surface 23b of the intermediate layer 23 (a side surface on the outer side, that is, a side surface on a side opposite to the gap S side), a side surface 22a of the first laminate 22, and a side surface 21a of the reflection prevention layer 21, so as to reach the first surface 11a. That is, the covering portion 33 covers the outer edge of the intermediate layer 23, the outer edge of the first laminate 22, and the outer edge of the reflection prevention layer 21.

The peripheral edge portion 34 surrounds the covering portion 33 when viewed in a direction perpendicular to the first surface 11a. The peripheral edge portion 34 is positioned on the first surface 11a in the outer edge portion 11c. The outer edge of the peripheral edge portion 34 is aligned with the outer edge of the substrate 11 when viewed in a direction perpendicular to the first surface 11a. The peripheral edge portion 34 is thinned along an outer edge of the outer edge portion 11c. That is, the portion along the outer edge of the outer edge portion 11c in the peripheral edge portion 34 is thinner compared to other portions excluding the portion along the outer edge of the peripheral edge portion 34. In the Fabry-Perot interference filter 1, the peripheral edge portion 34 is thinned by removing a portion of the polysilicon layer 27 and the silicon nitride layer 28 included in the second laminate 24. The peripheral edge portion 34 includes a non-thinned portion 34a continuous to the covering portion 33, and a thinned portion 34b surrounding the non-thinned portion 34a. In the thinned portion 34b, the polysilicon layer 27 and the silicon nitride layer 28 are removed excluding the polysilicon layer 27a directly provided on the first surface 11a.

The height from the first surface 11a to a surface 34c of the non-thinned portion 34a on a side opposite to the substrate 11 is lower than the height from the first surface 11a to the surface 23a of the intermediate layer 23. The height from the first surface 11a to the surface 34c of the non-thinned portion 34a ranges from 100 nm to 5000 nm, for example. The height from the first surface 11a to the surface 23a of the intermediate layer 23 ranges from 500 nm to 20000 nm, for example. The width of the thinned portion 34b (distance between the outer edge of the non-thinned portion 34a and the outer edge of the outer edge portion 11c when viewed in the direction perpendicular to the first surface 11a) is 0.01 times or more the thickness of the substrate 11. The width of the thinned portion 34b ranges from 5 μm to 400 μm, for example. The thickness of the substrate 11 ranges from 500 μm to 800 μm, for example.

A first electrode 12 is formed in the first mirror portion 31 so as to surround the light transmission region 1a when viewed in a direction perpendicular to the first surface 11a. The first electrode 12 is formed by doping impurities into the polysilicon layer 25c to achieve low resistivity. A second electrode 13 is formed in the first mirror portion 31 so as to include the light transmission region 1a when viewed in a direction perpendicular to the first surface 11a. The second electrode 13 is formed by doping impurities into the polysilicon layer 25c to achieve low resistivity. Note that although it is preferable that the second electrode 13 is sized to include the entire light transmission region 1a when viewed in a direction perpendicular to the first surface 11a, the second electrode 13 may have substantially the same size as that of the light transmission region 1a.

A third electrode 14 is formed in the second mirror portion 32. The third electrode 14 faces the first electrode 12 and the second electrode 13 via the gap S. The third electrode 14 is formed by doping impurities into the polysilicon layer 27a to achieve low resistivity.

A pair of terminals 15 are provided to face each other across the light transmission region 1a. Each of the terminals 15 is disposed inside a through-hole leading from the surface 24a of the second laminate 24 to the first laminate 22. Each of the terminals 15 is electrically connected to the first electrode 12 through wiring 12a. For example, each of the terminals 15 is formed with a metal film of aluminum, an alloy thereof, or the like.

A pair of terminals 16 are provided to face each other across the light transmission region 1a. Each of the terminals 16 is disposed inside a through-hole leading from the surface 24a of the second laminate 24 to the first laminate 22. Each of the terminals 16 is electrically connected to the second electrode 13 through wiring 13a and is electrically connected to the third electrode 14 through wiring 14a. For example, the terminals 16 are formed with a metal film of aluminum, an alloy thereof, or the like. The facing direction of the pair of terminals 15 and the facing direction of the pair of terminals 16 are orthogonal to each other (refer to FIG. 1).

A plurality of trenches 17 and 18 is provided on a surface 22b of the first laminate 22. The trench 17 annularly extends to surround a connection with respect to the terminals 16 in the wiring 13a. The trench 17 electrically insulates the first electrode 12 and the wiring 13a from each other. The trench 18 annularly extends along an inner edge of the first electrode 12. The trench 18 electrically insulates the first electrode 12 and a region of the first electrode 12 on an inner side (second electrode 13) from each other. Each of the regions within the trenches 17 and 18 may be an insulating material or a gap.

A trench 19 is provided on the surface 24a of the second laminate 24. The trench 19 annularly extends to surround the terminals 15. The trench 19 electrically insulates the terminals 15 and the third electrode 14 from each other. The region inside the trench 19 may be an insulating material or a gap.

The second surface 11b of the substrate 11 includes layers of a reflection prevention layer 41, a third laminate 42, an intermediate layer 43, and a fourth laminate 44 laminated in this order. The reflection prevention layer 41 and the intermediate layer 43 each have a configuration similar to those of the reflection prevention layer 21 and the intermediate layer 23. The third laminate 42 and the fourth laminate 44 each have a laminated structure symmetrical to those of the first laminate 22 and the second laminate 24 with respect to the substrate 11. The reflection prevention layer 41, the third laminate 42, the intermediate layer 43, and the fourth laminate 44 have a function of suppressing warpage of the substrate 11.

The third laminate 42, the intermediate layer 43, and the fourth laminate 44 are thinned along the outer edge of the outer edge portion 11c. That is, the portion along the outer edge of the outer edge portion 11c in the third laminate 42, the intermediate layer 43, and the fourth laminate 44 is thinner compared to other portions excluding the portion along the outer edge in the third laminate 42, the intermediate layer 43, and the fourth laminate 44. In the Fabry-Perot interference filter 1, the third laminate 42, the intermediate layer 43, and the fourth laminate 44 are thinned by removing all of the third laminate 42, the intermediate layer 43, and the fourth laminate 44 in a portion overlapping the thinned portion 34b when viewed in a direction perpendicular to the first surface 11a.

The third laminate 42, the intermediate layer 43, and the fourth laminate 44 have an opening 40a so as to include the light transmission region 1a when viewed in a direction perpendicular to the first surface 11a. The opening 40a has a diameter approximately the same as the size of the light transmission region 1a. The opening 40a is open on the light emission side. The bottom surface of the opening 40a reaches the reflection prevention layer 41.

A light shielding layer 45 is formed on a surface of the fourth laminate 44 on the light emission side. For example, the light shielding layer 45 is formed of aluminum or the like. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is formed of aluminum oxide. An optical influence due to the protective layer 46 can be disregarded by causing the thickness of the protective layer 46 to range from 1 nm to 100 nm (preferably, approximately 30 nm).

In the Fabry-Perot interference filter 1 configured as described above, when a voltage is applied between the first electrode 12 and the third electrode 14 via the pair of terminals 15 and 16, an electrostatic force corresponding to the voltage is generated between the first electrode 12 and the third electrode 14. The second mirror portion 32 is attracted to the first mirror portion 31 side secured to the substrate 11 by the electrostatic force, and the distance between the first mirror portion 31 and the second mirror portion 32 is adjusted. In this manner, in the Fabry-Perot interference filter 1, the distance between the first mirror portion 31 and the second mirror portion 32 changes by the electrostatic force.

The wavelength of light to be transmitted through the Fabry-Perot interference filter 1 depends on the distance between the first mirror portion 31 and the second mirror portion 32 in the light transmission region 1a. Therefore, the wavelength of light to be transmitted through the Fabry-Perot interference filter 1 can be appropriately selected by adjusting the voltage to be applied between the first electrode 12 and the third electrode 14. At this time, the second electrode 13 has the same potential as that of the third electrode 14. Therefore, the second electrode 13 functions as a compensation electrode to keep the first mirror portion 31 and the second mirror portion 32 flat in the light transmission region 1a.

In the Fabry-Perot interference filter 1, for example, a spectroscopic spectrum can be obtained by detecting light transmitted through the light transmission region 1a of the Fabry-Perot interference filter 1 using a light detector while changing the voltage to be applied to the Fabry-Perot interference filter 1 (that is, while changing the distance between the first mirror portion 31 and the second mirror portion 32 in the Fabry-Perot interference filter 1).

Figure 4:
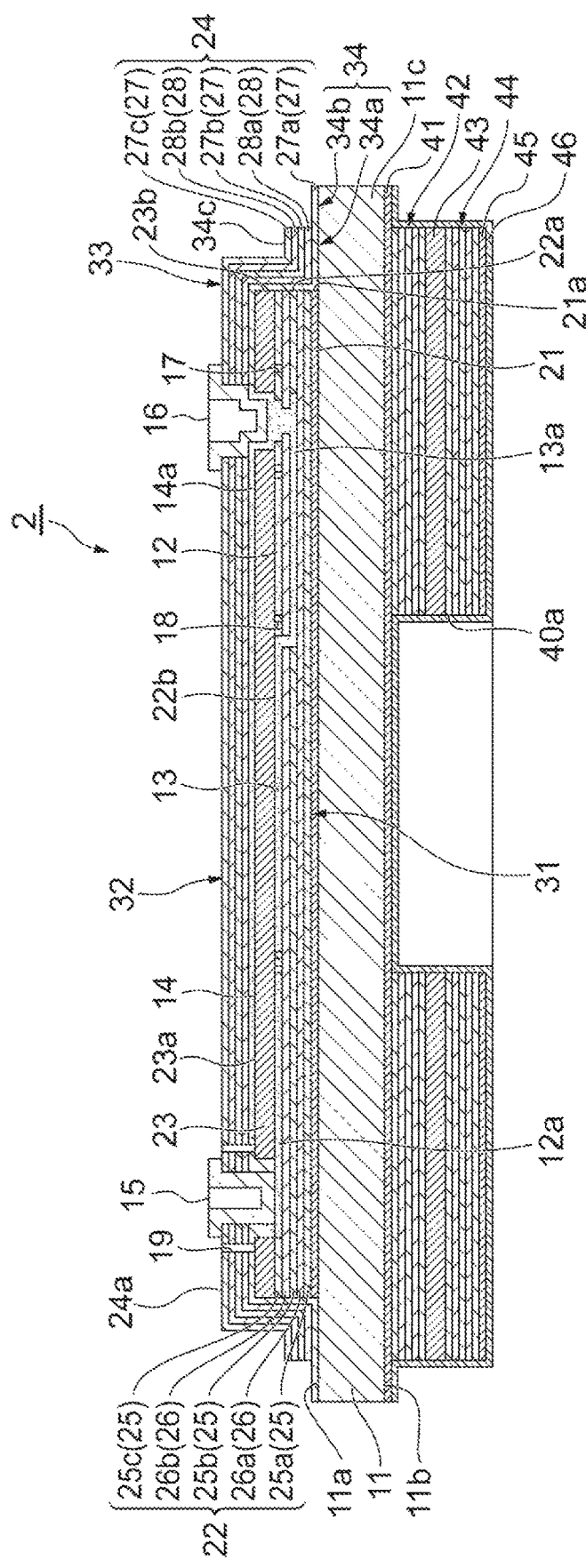
FIG. 4 is a cross-sectional view of a dummy filter cut out from a wafer according to one embodiment.

As illustrated in FIG. 4, the dummy filter 2 is different from the Fabry-Perot interference filter 1 described above in that the plurality of through-holes 24b is not formed in the second laminate 24 and the gap S is not formed in the intermediate layer 23. In the dummy filter 2, an intermediate layer 23 is provided between the first mirror portion 31 and the second mirror portion 32. That is, the second mirror portion 32 is disposed on the surface 23a of the intermediate layer 23, not floating above the gap S.

[Wafer Configuration]

Figure 5:
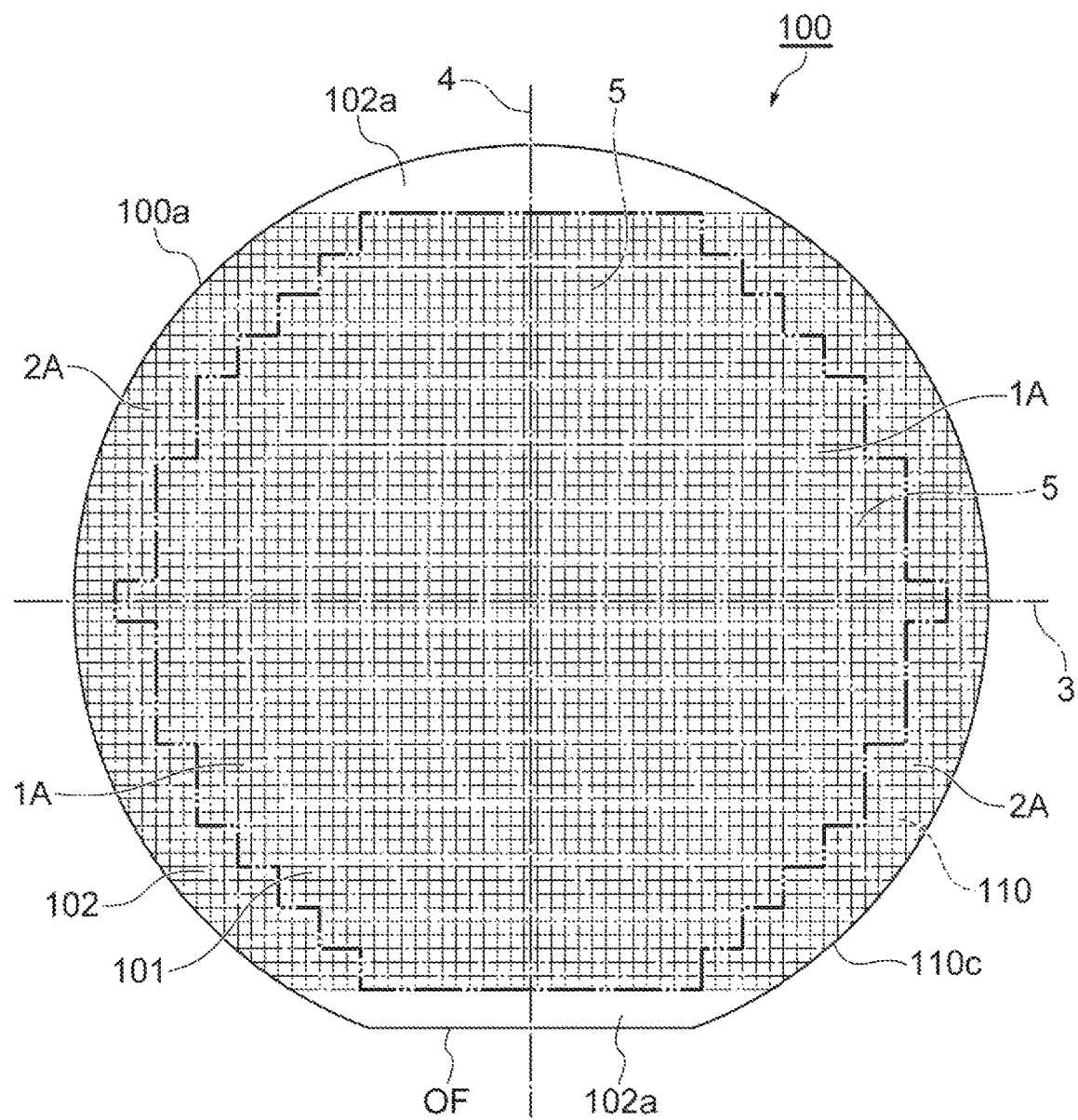
FIG. 5 is a plan view of a wafer according to one embodiment.
Figure 6:
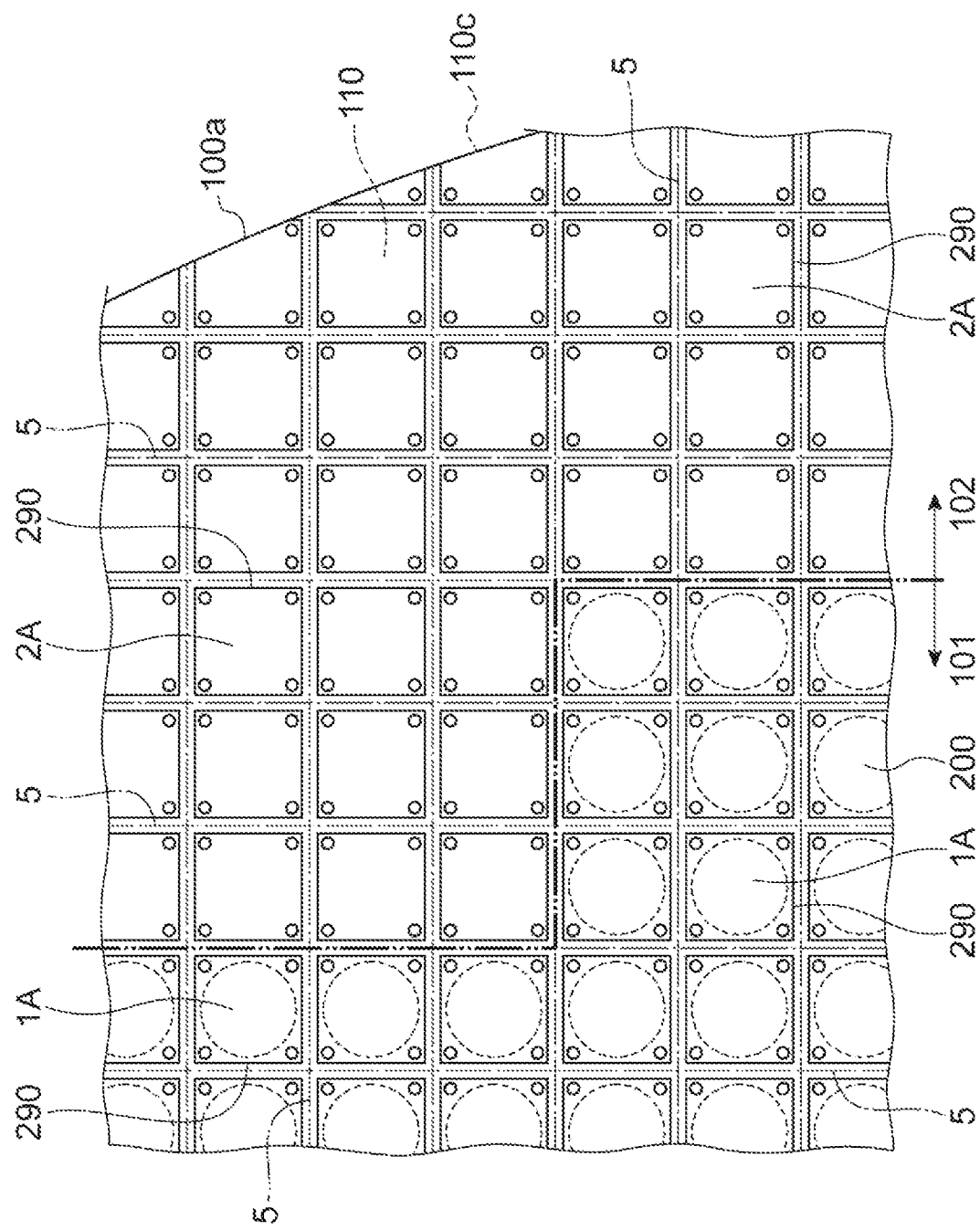
FIG. 6 is an enlarged plan view of a portion of the wafer illustrated in FIG. 5.

Next, a configuration of a wafer according to an embodiment will be described. As illustrated in FIGS. 5 and 6, a wafer 100 includes a substrate layer 110. The substrate layer 110 has a disk shape for example, with an orientation flat OF formed in a portion of the substrate layer 110. For example, the substrate layer 110 is formed of silicon, quartz, glass, or the like. Hereinafter, a virtual straight line that passes through the center of the substrate layer 110 when viewed in the thickness direction of the substrate layer 110 and is parallel to the orientation flat OF is referred to as a first straight line 3, while a virtual straight line that passes through the center of the substrate layer 110 when viewed in the thickness direction of the substrate layer 110 and is perpendicular to the orientation flat OF is referred to as a second straight line 4.

The wafer 100 includes an effective area 101 and a dummy area 102. The dummy area 102 is an area along an outer edge 110c of the substrate layer 110 (that is, the outer edge 100a of the wafer 100). The effective area 101 is an area inside the dummy area 102. The dummy area 102 surrounds the effective area 101 when viewed in the thickness direction of the substrate layer 110. The dummy area 102 is adjacent to the effective area 101.

The effective area 101 includes a plurality of two-dimensionally arranged Fabry-Perot interference filter portions 1A. The plurality of Fabry-Perot interference filter portions 1A is provided in the entire effective area 101. The dummy area 102 includes a plurality of two-dimensionally arranged dummy filter portions 2A. The plurality of dummy filter portions 2A is provided in an area of the dummy area 102 excluding a pair of areas 102a. One area 102a is an area along the orientation flat OF. The other area 102a is an area along the portion of the outer edge 110c of the substrate layer 110 on the side opposite to the orientation flat OF. The Fabry-Perot interference filter portion 1A and the dummy filter portion 2A are adjacent to each other at a boundary between the effective area 101 and the dummy area 102. When viewed in the thickness direction of the substrate layer 110, the outer shape of the Fabry-Perot interference filter portion 1A and the outer shape of the dummy filter portion 2A are the same. The plurality of Fabry-Perot interference filter portions 1A and the plurality of dummy filter portions 2A are arranged so as to be symmetric about each of the first straight line 3 and the second straight line 4 orthogonal to each other. The plurality of dummy filter portions 2A may be provided over the entire dummy area 102. Furthermore, the plurality of dummy filter portions 2A may be provided in an area other than one of the areas 102a in the dummy areas 102.

Each of the plurality of Fabry-Perot interference filter portions 1A is to be each of a plurality of Fabry-Perot interference filters 1 when the wafer 100 is cut along each of lines 5. Each of the plurality of dummy filter portions 2A is to be each of a plurality of dummy filters 2 when the wafer 100 is cut along each of the lines 5. When viewed in the thickness direction of the substrate layer 110, the plurality of lines 5 extends in a direction parallel to the orientation flat OF, and the plurality of lines 5 extends in a direction perpendicular to the orientation flat OF. As an example, when each of the filter portions 1A and 2A has a rectangular shape when viewed in the thickness direction of the substrate layer 110, each of the filter portions 1A and 2A is arranged in a two-dimensional matrix, and the plurality of lines 5 is set in a lattice pattern so as to pass between adjacent filter portions 1A-1A, between adjacent filter portions 1A-2A, and between adjacent filter portions 2A-2A.

Figure 7:
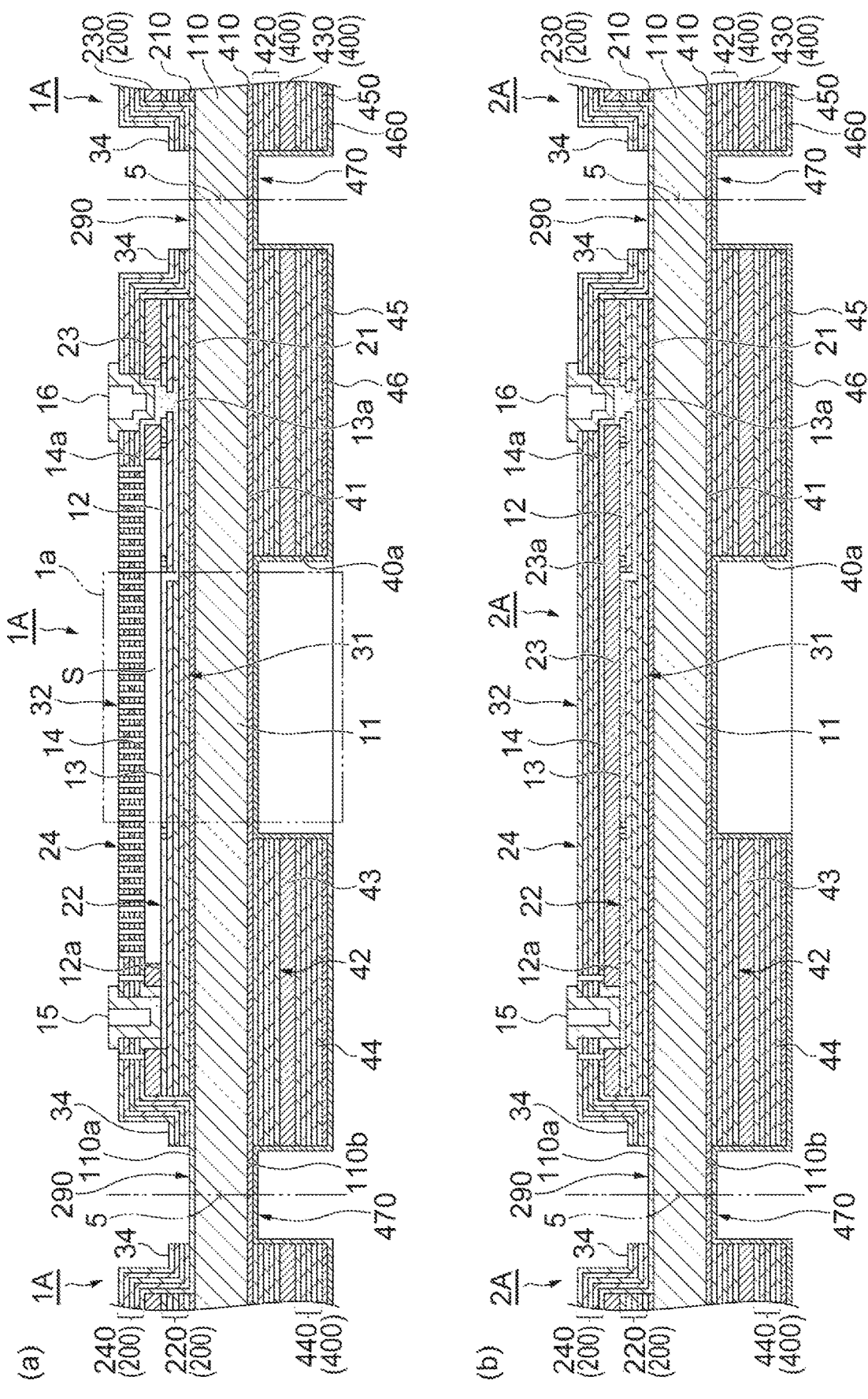
FIG. 7 is a cross-sectional view of a Fabry-Perot interference filter portion and a dummy filter portion of the wafer illustrated in FIG. 5.

(a) of FIG. 7 is a cross-sectional view of the Fabry-Perot interference filter portion 1A. (b) of FIG. 7 is a cross-sectional view of the dummy filter portion 2A. As illustrated in (a) and (b) of FIG. 7, the substrate layer 110 is a layer that is to be a plurality of substrates 11 when the wafer 100 is cut along each of the lines 5. The substrate layer 110 has a first surface 110a and a second surface 110b opposite to the first surface 110a. A reflection prevention layer 210 is provided on the first surface 110a of the substrate layer 110. The reflection prevention layer 210 is a layer to be a plurality of reflection prevention layers 21 when the wafer 100 is cut along each of the lines 5. A reflection prevention layer 410 is provided on the second surface 110b of the substrate layer 110. The reflection prevention layer 410 is a layer to be a plurality of reflection prevention layers 41 when the wafer 100 is cut along each of the lines 5.

A device layer 200 is provided on the reflection prevention layer 210. The device layer 200 includes a first mirror layer 220, an intermediate layer 230, and a second mirror layer 240. The first mirror layer 220 is a layer having a plurality of first mirror portions 31, and is a layer to be a plurality of first laminates 22 when the wafer 100 is cut along each of the lines 5. The plurality of first mirror portions 31 is two-dimensionally arranged on the first surface 110a of the substrate layer 110 via the reflection prevention layer 210. The intermediate layer 230 is a layer to be a plurality of intermediate layers 23 when the wafer 100 is cut along each of the lines 5. The second mirror layer 240 is a layer having a plurality of second mirror portions 32, and is a layer to be a plurality of second laminates 24 when the wafer 100 is cut along each of the lines 5. The plurality of second mirror portions 32 is two-dimensionally arranged on the first mirror layer 220 via the intermediate layer 23.

A stress adjustment layer 400 is provided on the reflection prevention layer 410. That is, the stress adjustment layer 400 is provided on the second surface 110b of the substrate layer 110 via the reflection prevention layer 410. The stress adjustment layer 400 includes a plurality of layers 420, 430, and 440. The layer 420 is a layer that is to be a plurality of third laminates 42 when the wafer 100 is cut along each of the lines 5. The layer 430 is a layer to be a plurality of intermediate layers 43 when the wafer 100 is cut along each of the lines 5. The layer 440 is a layer to be a plurality of fourth laminates 44 when the wafer 100 is cut along each of the lines 5.

A light shielding layer 450 and a protective layer 460 are provided on the stress adjustment layer 400. The light shielding layer 450 is a layer that is to be a plurality of light shielding layers 45 when the wafer 100 is cut along each of the lines 5. The protective layer 460 is a layer that is to be a plurality of protective layers 46 when the wafer 100 is cut along each of the lines 5.

As illustrated in (a) of FIG. 7, each of the Fabry-Perot interference filter portions 1A has a gap S formed between a portion of the first mirror layer 220 at least including the first mirror portion 31 and a portion of the second mirror layer 240 at least including the second mirror portion 32 facing each other. That is, in each of the Fabry-Perot interference filter portions 1A, the intermediate layer 23 defines the gap S, and the second mirror portion 32 floats on the gap S. As illustrated in FIG. 1, in the present embodiment, the gap S is formed in a circular region slightly larger than the light transmission region 1a when viewed in a direction in which the first mirror portion 31 and the second mirror portion 32 face each other (hereinafter, simply referred to as "facing direction"). Similarly to the configuration of the Fabry-Perot interference filter 1 described above, each of the Fabry-Perot interference filter portions 1A includes a configuration related to the first electrode 12, the second electrode 13, the third electrode 14, the plurality of terminals 15 and 16, the opening 40a, and the like. Therefore, even when the plurality of Fabry-Perot interference filter portions 1A is still in the state of the wafer 100, applying a voltage to each of the Fabry-Perot interference filter portions 1A via the pair of terminals 15 and 16 would change the distance between the first mirror portion 31 and the second mirror portion 32 facing each other by the electrostatic force.

As illustrated in (b) of FIG. 7, each of the dummy filter portions 2A includes the intermediate layer 23 provided between the first mirror portion 31 and the second mirror portion 32 facing each other. That is, in the dummy filter portion 2A, the intermediate layer 23 does not define the gap S, and the second mirror portion 32 is disposed on the surface 23a of the intermediate layer 23. Accordingly, although each of the dummy filter portions 2A has a configuration related to the first electrode 12, the second electrode 13, the third electrode 14, the plurality of terminals 15 and 16, the openings 40a, and the like, similarly to the configuration of the dummy filter 2 described above, the distance between the first mirror portion 31 and the second mirror portion 32 facing each other would not change. Note that each of the dummy filter portions 2A does not need to include the configuration related to the first electrode 12, the second electrode 13, the third electrode 14, the plurality of terminals 15 and 16 (a metal film such as aluminum to form each of the terminal 15 and 16, through-holes for disposing each of the terminals 15 and 16, and the like), the opening 40a, and the like.

As illustrated in FIG. 6 and (a) of FIG. 7, the device layer 200 has a first groove 290 opening on the side opposite to the substrate layer 110. The first groove 290 is formed along each of the lines 5. The first groove 290 surrounds the first mirror portion 31, the intermediate layer 23, and the second mirror portion 32 in each of the Fabry-Perot interference filter portions 1A and each of the dummy filter portions 2A. In each of the Fabry-Perot interference filter portions 1A, the first mirror portion 31, the intermediate layer 23, and the second mirror portion 32 are surrounded by the annularly continuous first groove 290. Similarly, in each of the dummy filter portions 2A, the first mirror portion 31, the intermediate layer 23, and the second mirror portion 32 are surrounded by the annularly continuous first groove 290. Focusing on the adjacent filter portions 1A-1A, the adjacent filter portions 1A-2A, and the adjacent filter portions 2A-2A, the first groove 290 corresponds to a region on a peripheral edge portion 34 of one filter portion and a peripheral edge portion 34 of the other filter portion. The first groove 290 is continuous in the effective area 101 and the dummy area 102 and reaches the outer edge 110c of the substrate layer 110 when viewed in the facing direction. It is sufficient as long as the first groove 290 surrounds at least the second mirror portion 32 in each of the Fabry-Perot interference filter portions 1A and each of the dummy filter portions 2A.

As illustrated in (b) of FIG. 7, the stress adjustment layer 400 has a second groove 470 opening on the side opposite to the substrate layer 110. The second groove 470 is formed along each of the lines 5. That is, the second groove 470 is formed so as to correspond to the first groove 290. Here, formation of the second groove 470 corresponding to the first groove 290 means that the second groove 470 overlaps the first groove 290 when viewed in the facing direction. Therefore, the second groove 470 is continuous in the effective area 101 and the dummy area 102 and reaches the outer edge 110c of the substrate layer 110 when viewed in the facing direction.

[Wafer Manufacturing Method]

Next, a method for manufacturing the wafer 100 will be described with reference to FIGS. 8 to 13. In FIGS. 8 to 13, (a) is cross-sectional view of a portion corresponding to the Fabry-Perot interference filter portion 1A, and (b) is a cross-sectional view of a portion corresponding to the dummy filter portion 2A.

Figure 8:
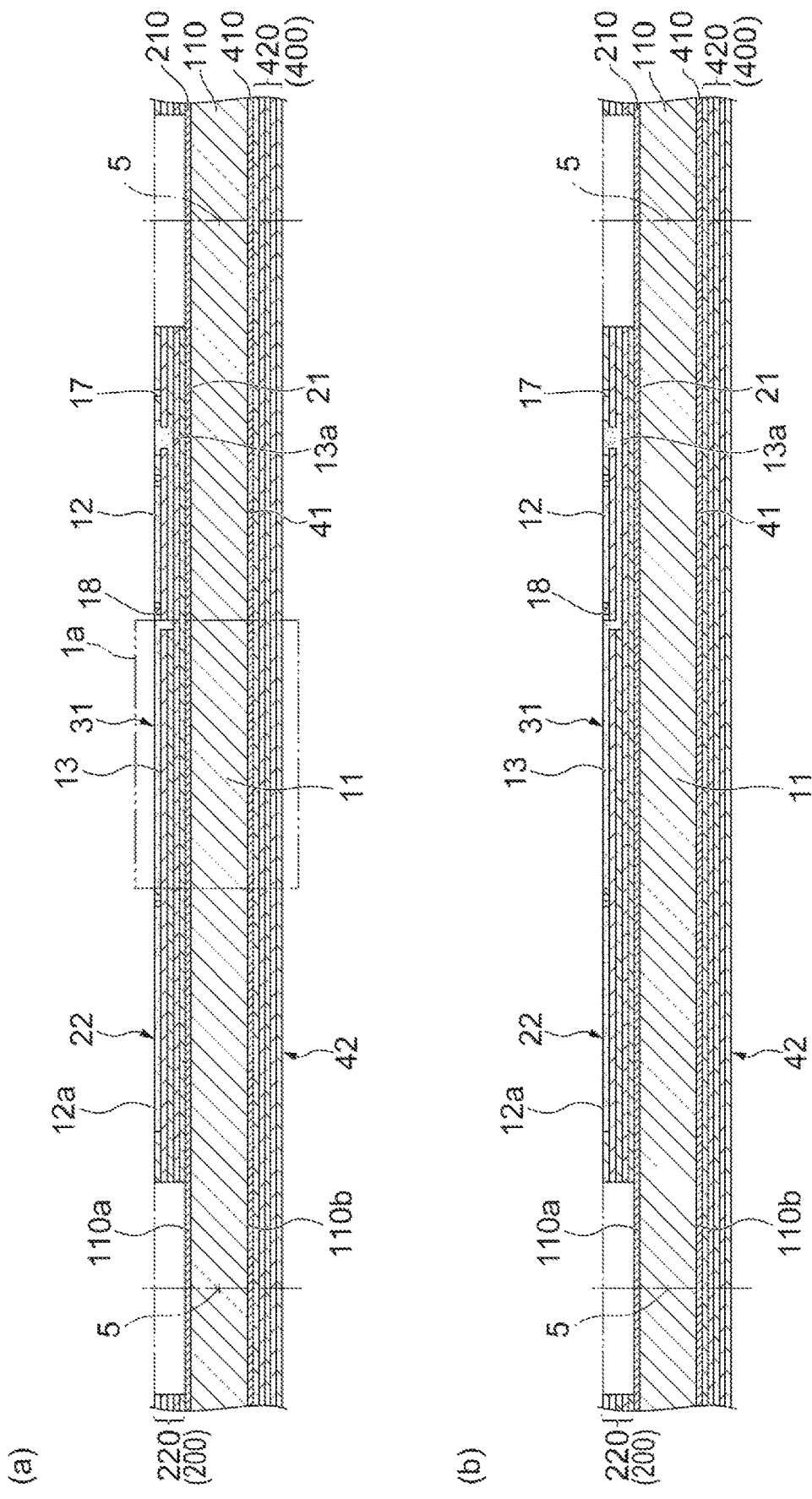
FIG. 8 is a cross-sectional view illustrating a method for manufacturing the wafer illustrated in FIG. 5.

First, as illustrated in FIG. 8, the reflection prevention layer 210 is formed on the first surface 110a of the substrate layer 110 together with formation of the reflection prevention layer 410 on the second surface 110b of the substrate layer 110. Subsequently, a plurality of polysilicon layers and a plurality of silicon nitride layers are alternately laminated on each of the reflection prevention layers 210 and 410, so as to form the first mirror layer 220 on the reflection prevention layer 210 and form the layer 420 on the reflection prevention layer 410.

When the first mirror layer 220 is formed, etching is performed to remove a portion along each of the lines 5 in the first mirror layer 220 so as to expose the surface of the reflection prevention layer 210. In addition, by doping impurities to achieve low resistivity in a portion of a predetermined polysilicon layer in the first mirror layer 220, the first electrode 12, the second electrode 13, and the wiring 12a and 13a are formed in each of portions corresponding to the substrate 11. Moreover, etching is performed to form the trenches 17 and 18 on a surface of the first mirror layer 220 in each of portions corresponding to the substrate 11.

Figure 9:
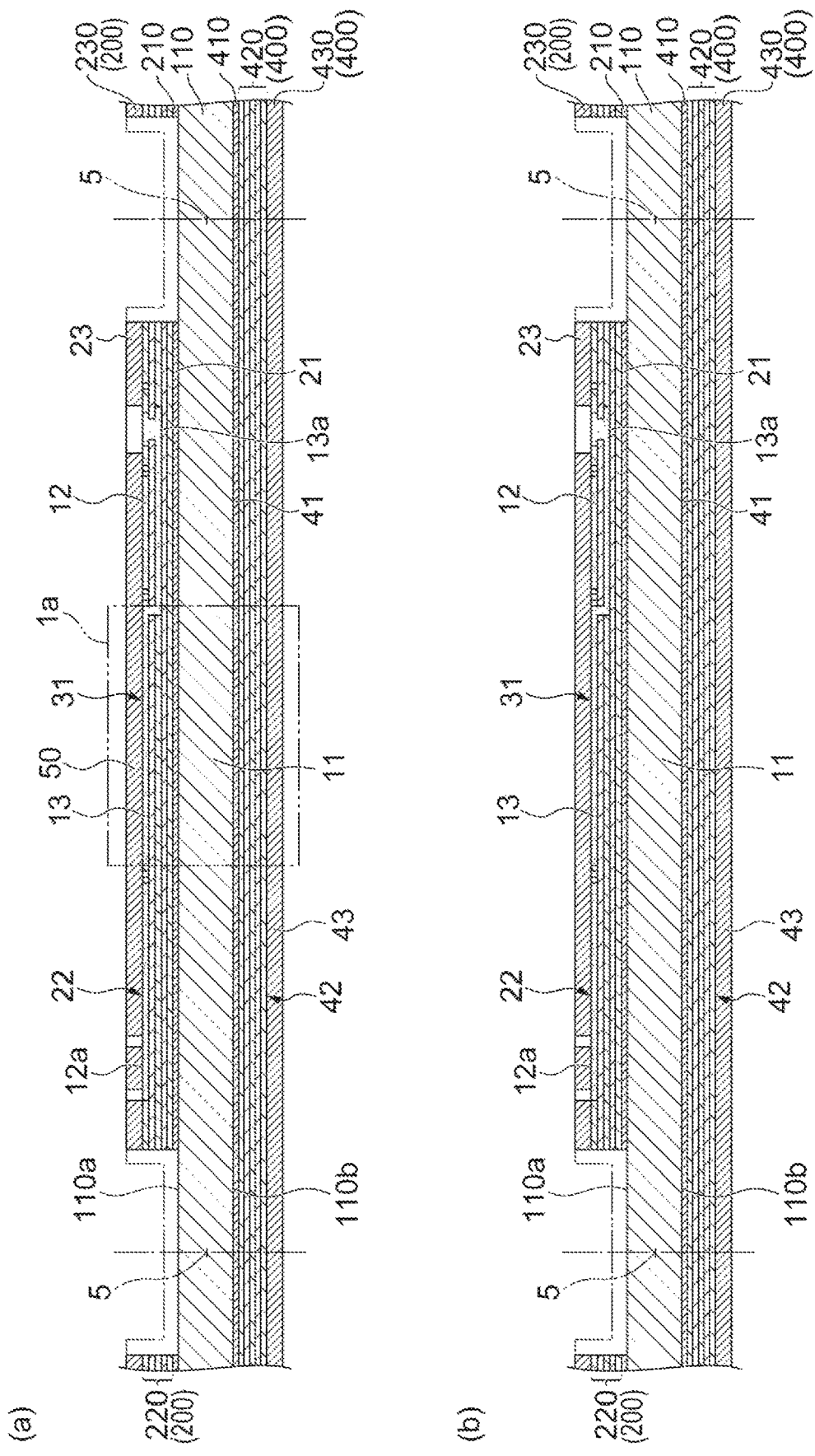
FIG. 9 is a cross-sectional view illustrating a method for manufacturing the wafer illustrated in FIG. 5.

Subsequently, as illustrated in FIG. 9, the intermediate layer 230 is formed on the first mirror layer 220 and on the exposed surface of the reflection prevention layer 210, and the layer 430 is formed on the layer 420. At a portion corresponding to each of the Fabry-Perot interference filter portions 1A, the intermediate layer 230 includes a portion 50 expected to be removed corresponding to the gap S (refer to FIG. 3). Subsequently, etching is performed to remove a portion along each of the lines 5 in the intermediate layer 230 and the reflection prevention layer 210 so as to expose the first surface 110a of the substrate layer 110. In addition, the etching is performed to form a gap at a portion corresponding to each of the terminals 15 and 16 (refer to FIG. 3) in the intermediate layer 230 for each of portions corresponding to the substrate 11.

Figure 10:
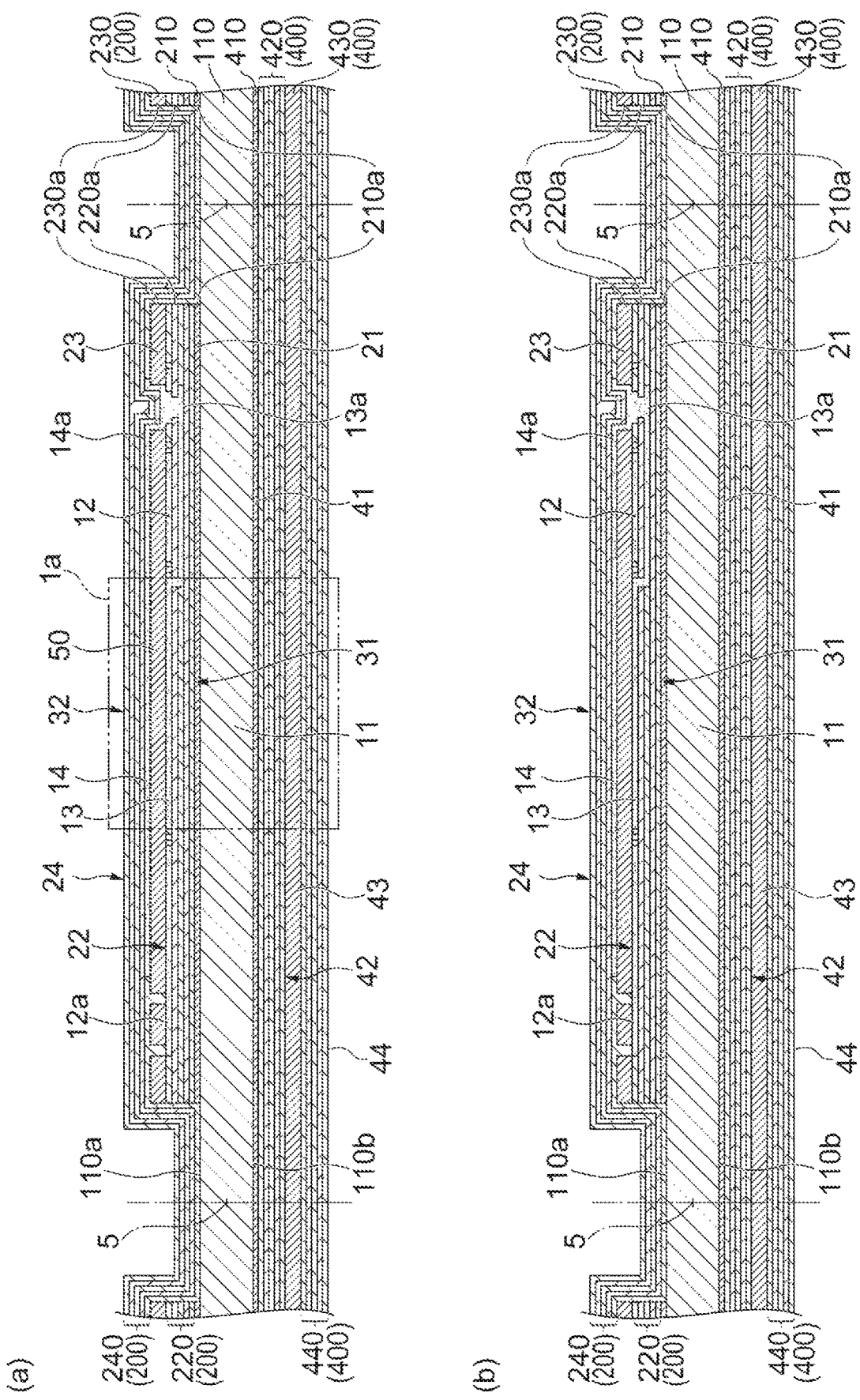
FIG. 10 is a cross-sectional view illustrating a method for manufacturing the wafer illustrated in FIG. 5.
Figure 11:
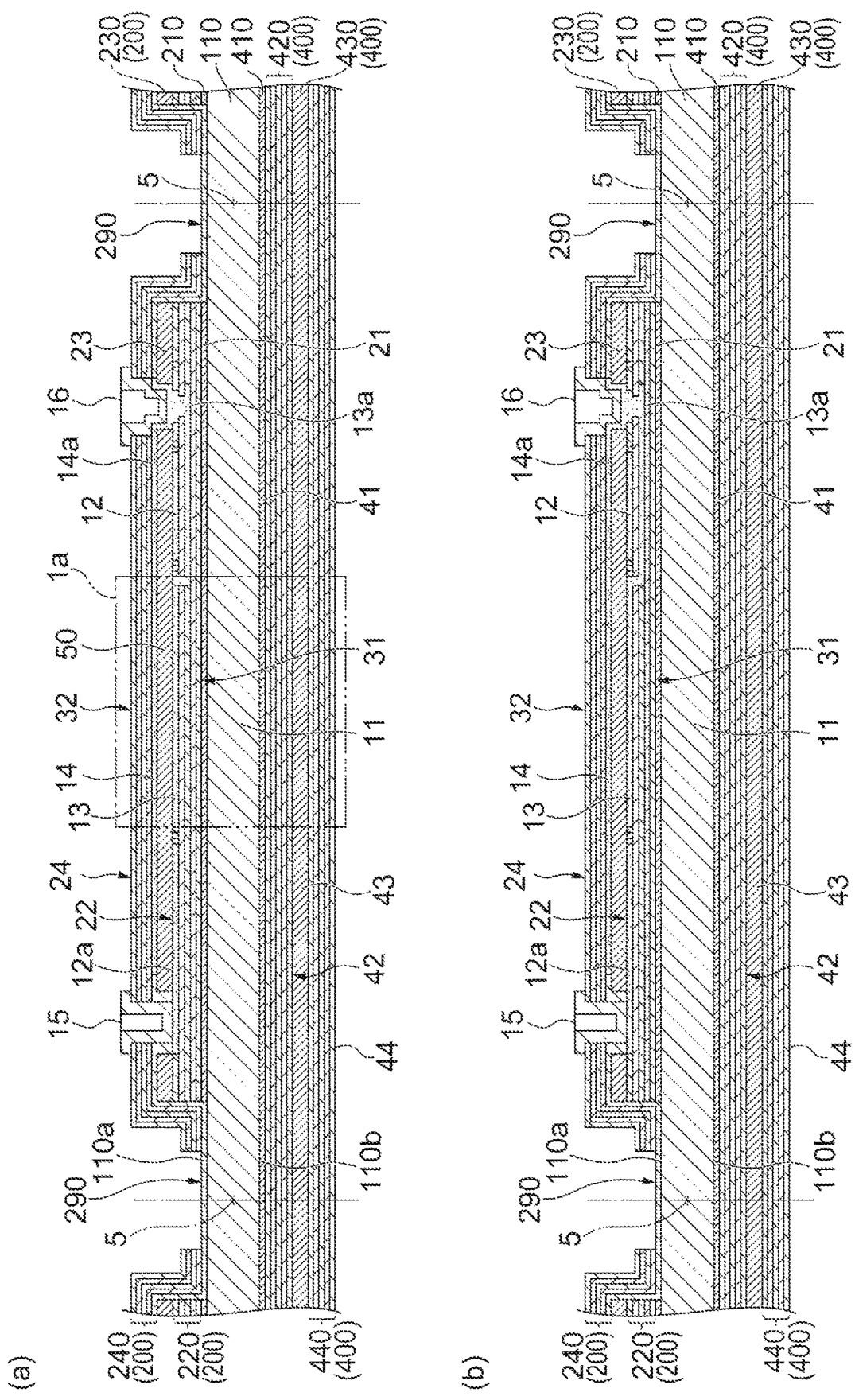
FIG. 11 is a cross-sectional view illustrating a method for manufacturing the wafer illustrated in FIG. 5.

Subsequently, as illustrated in FIG. 10, a plurality of polysilicon layers and a plurality of silicon nitride layers are alternately laminated on each of the first surface 110a side and the second surface 110b side of the substrate layer 110, thereby forming the second mirror layer 240 on the intermediate layer 230 and on the exposed first surface 110a of the substrate layer 110, as well as forming the layer 440 on the layer 430.

When the second mirror layer 240 is formed, side surfaces 230a of the intermediate layer 230, side surfaces 220a of the first mirror layer 220, and side surfaces 210a of the reflection prevention layer 210, facing each other along the line 5, are covered with the second mirror layer 240. In addition, by doping impurities to achieve low resistivity in a portion of a predetermined polysilicon layer in the second mirror layer 240, the third electrode 14 and the wiring 14a are formed in each of portions corresponding to the substrate 11.

Subsequently, as illustrated in FIG. 11(b), etching is performed to thin a portion along each of the lines 5 in the second mirror layer 240 so as to expose the surface of the polysilicon layer 27a (refer to FIG. 3) (that is, the polysilicon layer positioned closest to the first surface 110a side) included in the second mirror layer 240. In addition, the etching is performed to form a gap at a portion corresponding to each of the terminals 15 and 16 (refer to FIG. 3) in the second mirror layer 240 for each of portions corresponding to the substrate 11. Subsequently, the terminals 15 and 16 are formed in the gap for each of portions corresponding to the substrate 11, and the terminal 15 and the wiring 12a are connected to each other, while the terminal 16 and each of the wiring 13a and the wiring 14a are connected to each other.

With the procedure above, the reflection prevention layer 210 and the device layer 200 are formed on the first surface 110a of the substrate layer 110, while the first groove 290 is formed in the device layer 200. The first groove 290 is a region where the device layer 200 is partially thinned along each of the lines 5.

Figure 12:
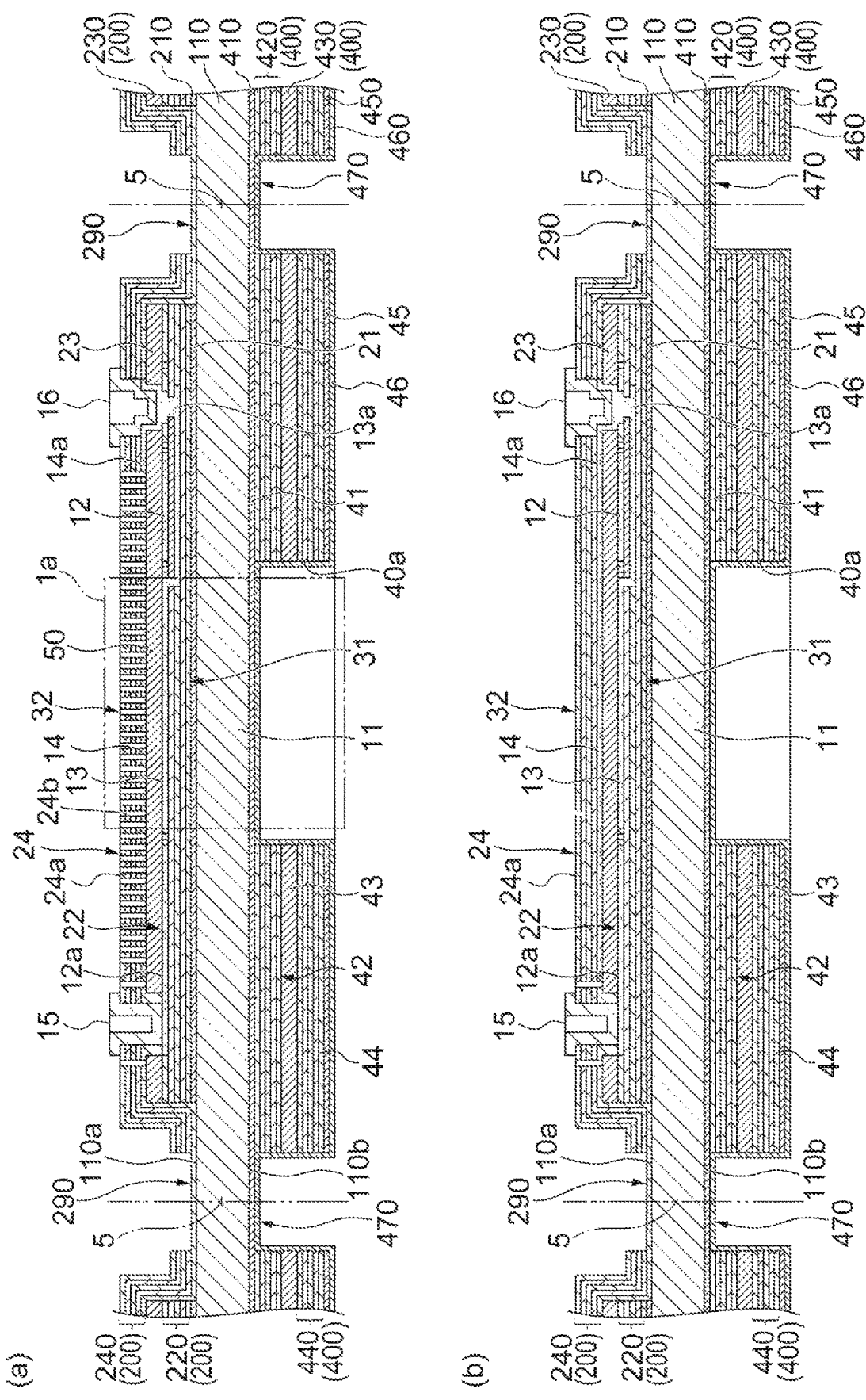
FIG. 12 is a cross-sectional view illustrating a method for manufacturing the wafer illustrated in FIG. 5.

Subsequently, as illustrated in (a) of FIG. 12, etching is performed in each of portions corresponding to the Fabry-Perot interference filter portion 1A so as to form, in the second laminate 24, the plurality of through-holes 24b leading from the surface 24a of the second laminate 24 to the portion 50 expected to be removed. At this time, as illustrated in (b) of FIG. 12, the plurality of through-holes 24b will not be formed in the second laminate 24 in a portion corresponding to each of the dummy filter portions 2A. Subsequently, as illustrated in FIG. 12, the light shielding layer 450 is formed on the layer 440. Subsequently, etching is performed to remove a portion along each of the lines 5 in the light shielding layer 450 and the stress adjustment layer 400 (that is, the layers 420, 430, and 440) so as to expose the surface of the reflection prevention layer 410. In addition, the etching is performed to form the opening 40a in each of portions corresponding to the substrate 11. Subsequently, the protective layer 460 is formed on the light shielding layer 450, the exposed surface of the reflection prevention layer 410, an inner surface of the opening 40a, and the side surface of the stress adjustment layer 400 facing the second groove 470.

With the procedure above, the reflection prevention layer 410, the stress adjustment layer 400, the light shielding layer 450, and the protective layer 460 are formed on the second surface 110b of the substrate layer 110, while the second groove 470 is formed in the stress adjustment layer 400. The second groove 470 is a region in which the stress adjustment layer 400 is partially thinned along each of the lines 5.

Figure 13:
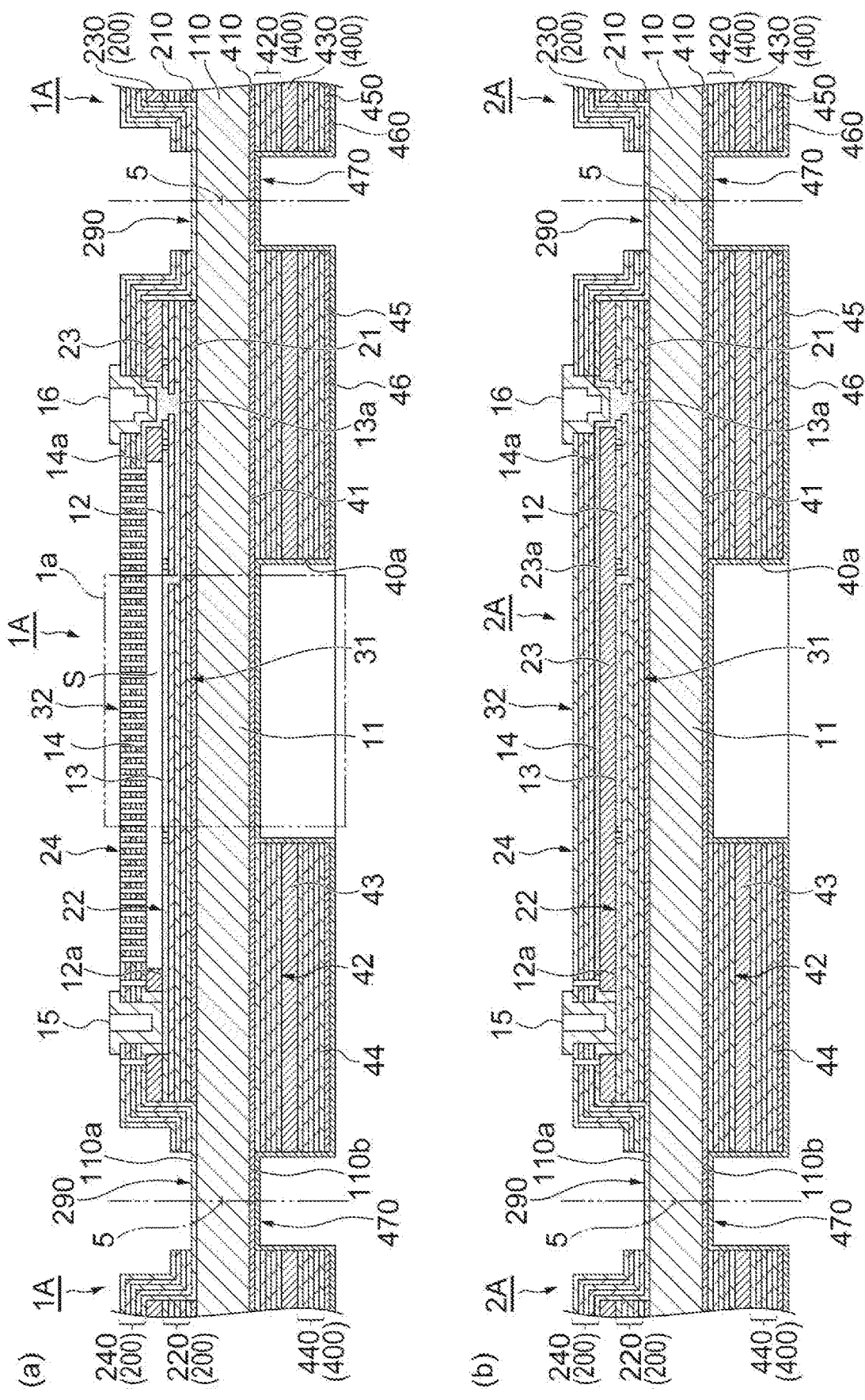
FIG. 13 is a cross-sectional view illustrating a method for manufacturing the wafer illustrated in FIG. 5.

Subsequently, as illustrated in (a) of FIG. 13, etching via a plurality of through-holes 24b (for example, gas phase etching using hydrofluoric acid gas) is performed at a portion corresponding to each of the Fabry-Perot interference filter portions 1A to collectively remove the plurality of portions 50 expected to be removed, from the intermediate layer 230. With this procedure, a gap S is formed in the portion corresponding to each of the Fabry-Perot interference filter portions 1A for each of portions corresponding to the substrate 11. At this time, as illustrated in (b) of FIG. 13, since the plurality of through-holes 24b is not formed in the second laminate 24 at the portion corresponding to each of the dummy filter portions 2A, the gap S will not be formed in the intermediate layer 230.

With the procedure described above, as illustrated in (a) of FIG. 7, the gap S is formed between the first mirror portion 31 and the second mirror portion 32 facing each other in the effective area 101, thereby forming the plurality of Fabry-Perot interference filter portions 1A. In contrast, in the dummy area 102, the intermediate layer 23 is provided between the first mirror portion 31 and the second mirror portion 32 facing each other as illustrated in (b) of FIG. 7, thereby forming the plurality of dummy filter portion 2A.

[Inspection Device and Method for Removing a Foreign Substance]

Figure 14:
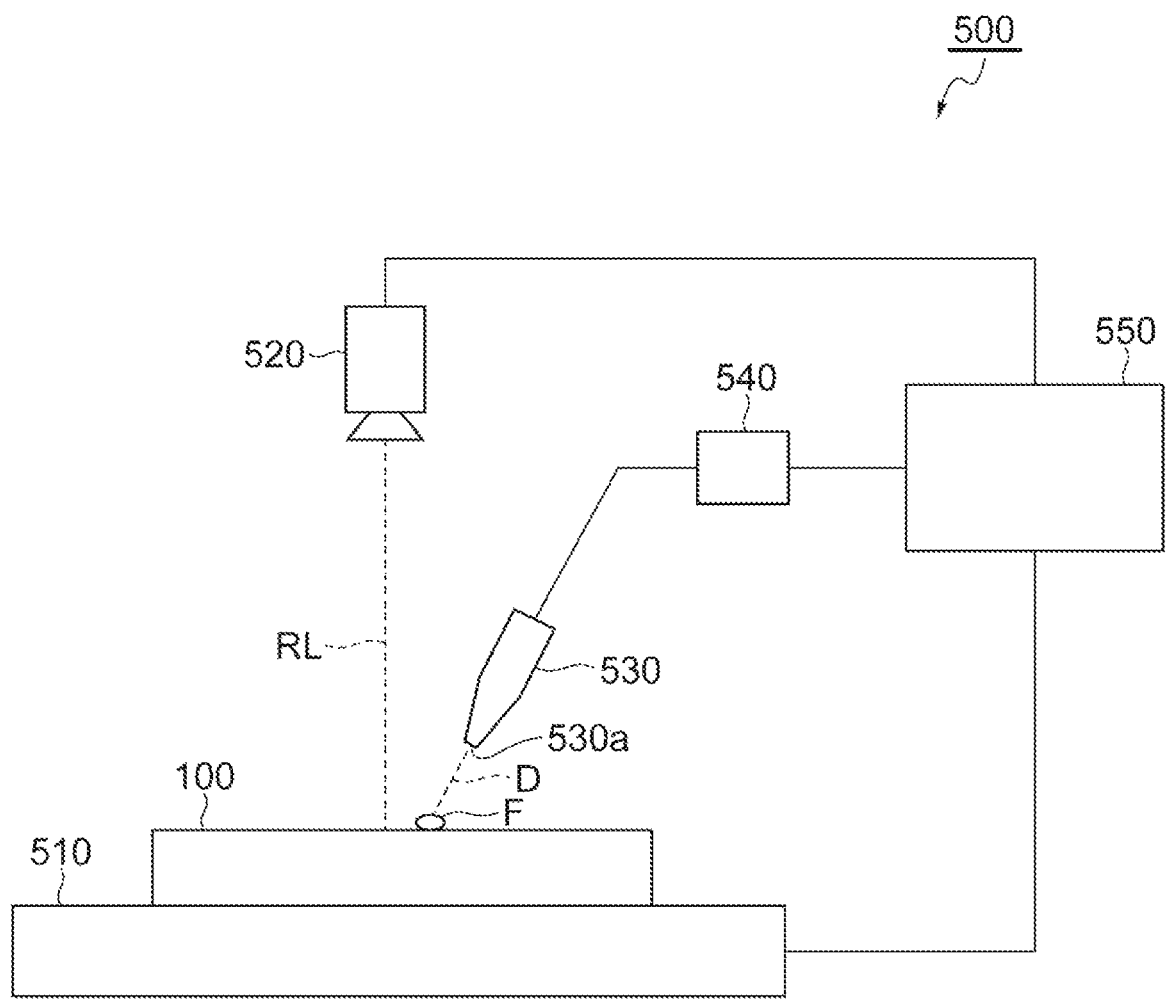
FIG. 14 is a schematic configuration diagram of a foreign substance removing device that performs a method for removing a foreign substance of one embodiment.

Next, a configuration of an inspection device that performs a method for removing a foreign substance of an embodiment will be described. As illustrated in FIG. 14, an inspection device 500 includes a wafer support 510, an imaging unit 520, a blow nozzle 530, a solenoid valve 540, and a control unit 550. The wafer support 510, the imaging unit 520, and the blow nozzle 530 are disposed in a box (not illustrated). Here, the inspection target of the inspection device 500 is the wafer 100. As an example, the inspection device 500 has a function of performing an appearance inspection of each of the Fabry-Perot interference filter portions 1A on the wafer 100 (specifically, the surface of the wafer 100), and a function of using air blow to remove a foreign substance detected in the appearance inspection.

The wafer support 510 supports the wafer 100 such that the facing direction of the wafer 100 (that is, the direction in which first mirror portion 31 and second mirror portion 32 face each other) is parallel to a reference line RL. For example, the wafer support 510 is stage movable along a plane perpendicular to the reference line RL (at least along each of two directions that are parallel to the plane and orthogonal to each other). The wafer support 510 may be rotatable around a line parallel to the reference line RL as a center line. The relative movement of the imaging unit 520 with respect to the wafer support 510 may be performed by the movement of the wafer support 510 as described above, may be performed by the movement of the imaging unit 520, or may also be performed by both of the movement of the wafer support 510 and the movement of the imaging unit 520. The similar applies to the relative movement of the blow nozzle 530 with respect to the wafer support 510.

The imaging unit 520 images the wafer 100 (specifically, the surface of the wafer 100) supported by the wafer support 510. The imaging unit 520 is a camera that emits observation light along the reference line RL, detects the light reflected on the surface of the wafer 100 supported by the wafer support 510, and outputs imaging data to the control unit 550, for example. The imaging unit 520 is set to image each of the Fabry-Perot interference filter portions 1A on the wafer 100 at a magnification of 10x or more, for example. Although the imaging unit 520 is disposed on the reference line RL, it is possible, for example, to dispose the imaging unit 520 at a position other than on the reference line RL when the mirror member that changes the traveling direction of observation light is disposed on the reference line RL.

The blow nozzle 530 is a device that blows (blows) the compressed air arriving from the solenoid valve 540 to the Fabry-Perot interference filter portion 1A in which a foreign substance F has been detected by image processing based on imaging data. The blow nozzle 530 may be either an air blow gun type nozzle capable of simultaneously blowing a relatively wide range or a needle type nozzle capable of blowing a relatively narrow range with a pinpoint precision. The air jetted by the blow nozzle 530 is, for example, dry air, antistatic air capable of removing static electricity, nitrogen (N2), or the like.

The solenoid valve 540 is connected to an air tank (not illustrated), and switches ON/OFF of the passage of the compressed air compressed to a predetermined air pressure to the blow nozzle 530 on the basis of a control signal from the control unit 550.

The control unit 550 is configured as a computer device including a processor, memory, storage, a communication device, or the like. In the control unit 550, the processor executes a predetermined piece of software (program) read into the memory or the like and controls data reading and writing or the like in the memory or storage, thereby implementing various functions. For example, the control unit 550 controls the operation of each unit (the wafer support 510, the imaging unit 520, the blow nozzle 530, and the solenoid valve 540) to implement a method for removing a foreign substance described below.

In the inspection device 500 configured as described above, the operation of each of units is controlled by the control unit 550, so that the method for removing a foreign substance is performed as follows. First, a wafer 100 as an inspection target is prepared and supported by the wafer support 510. At this time, the wafer 100 is supported by the wafer support 510 such that the facing direction is parallel to the reference line RL.

Subsequently, an appearance inspection is performed on each of the plurality of Fabry-Perot interference filter portions 1A on the wafer 100 supported by the wafer support 510. Specifically, a foreign substance adhering to the surface of the second mirror layer 240 of each of the Fabry-Perot interference filter portions 1A opposite to the first mirror layer 220 (portion to be the surface 24a by cutting the wafer 100 along each of lines 5) is detected on the basis of an image (imaging data) captured by the imaging unit 520. The above-described foreign substance detection is executed as follows, for example. First, the imaging unit 520 images the wafer 100 supported by the wafer support 510. The imaging data captured by the imaging unit 520 is output to the control unit 550. The control unit 550 executes image processing on the position and the imaging data of the imaging unit 520, and detects an appearance abnormality (foreign substance) on the surface of the Fabry-Perot interference filter portion 1A imaged by the imaging unit 520 on the basis of the result of the image processing. For example, the control unit 550 compares the Fabry-Perot interference filter portion 1A imaged by the imaging unit 520 with the previously stored pattern image (image of the Fabry-Perot interference filter portion without appearance abnormality), and thereby detects a foreign substance adhering to the surface of the imaged Fabry-Perot interference filter portion 1A. The control unit 550 stores information indicating the position (or region) of the detected foreign substance (for example, coordinate information (or information indicating a certain region depending on the range of coordinates)).

Instead of performing the above-described image processing (comparison with the pattern image in the present embodiment), the control unit 550 may display imaging data on a display (not illustrated) of the inspection device 500 and have an operator visually check the presence or absence of a foreign substance. When a foreign substance is discovered by the visual check, the operator designates a region corresponding to the foreign substance in the imaging data by using an input device (not illustrated) such as a keyboard provided in the inspection device 500, for example. In this case, control unit 550 may store information indicating the region designated by the operator.

Subsequently, the control unit 550 controls the operation of the blow nozzle 530 and the solenoid valve 540 in order to remove the detected foreign substance F.

First, the control unit 550 adjusts the position of the blow nozzle 530 on the basis of the detected position of the foreign substance F. That is, the control unit 550 adjusts an airflow peak position of the air discharged from the blow nozzle 530. The airflow peak is a portion having the highest air velocity. In the present embodiment, air is discharged from a tip 530a of the blow nozzle 530 in a direction D parallel to an extending direction of the blow nozzle 530. In this case, the airflow peak position is a position on a straight line in the direction D from the tip 530a of the blow nozzle 530. In the present embodiment, the control unit 550 adjusts the airflow peak position of the air discharged from the blow nozzle 530 to match the position of the foreign substance F. Specifically, the control unit 550 controls the position and posture of the blow nozzle 530 such that the foreign substance F overlaps a position on a straight line in the direction D from the tip 530a of the blow nozzle 530.

Subsequently, the control unit 550 controls the opening/closing operation of the solenoid valve 540 to feed the compressed air of a predetermined air pressure to the blow nozzle 530 for a predetermined time. Accordingly, air is discharged from the tip 530a of the blow nozzle 530. The air blows off the foreign substance F, thereby removing the foreign substance F.

Note that the control unit 550 may intentionally adjust the airflow peak position to a position not overlapping the foreign substance F. For example, when the foreign substance F is present on a portion of the second mirror layer 240 of the Fabry-Perot interference filter portion 1A overlapping the gap S when viewed in the facing direction (hereinafter, simply referred to as a "membrane portion"), the control unit 550 may control the position and posture of the blow nozzle 530 such that air is to be blown to a region on the membrane portion where the foreign substance F does not exist (region having the plurality of through-holes 24b). In this case, the air blown to the surface of the second mirror layer 240 can be introduced into the gap S via the plurality of through-holes 24b. The air that has entered the gap S is pushed out by air that newly enters the gap S, so as to be discharged toward the surface of the second mirror layer 240 via the through-hole 24b that is different from the through-hole 24b used as a passage of the air that newly enters the gap S. In this manner, the foreign substance F adhering to the surface of the second mirror layer 240 can be blown up by the air discharged to the outside from the gap S.

Here, in a case where the blow nozzle 530 is the above-described air blow gun type nozzle, it is possible to blow, with same timings, not only the surroundings of the foreign substance F (for example, the surface of the Fabry-Perot interference filter portion 1A to which the foreign substance F adheres), but also its further surroundings (region on the wafer 100 including the Fabry-Perot interference filter portions 1A other than the Fabry-Perot interference filter portion 1A to which the foreign substance F adheres). This makes it possible to blow off the foreign substance F to a position relatively far from the wafer 100 by the air, and thereby can reduce the possibility that the foreign substance F will re-adhere to a surface of another Fabry-Perot interference filter portion 1A on the wafer 100.

In contrast, in a case where the blow nozzle 530 is the above-described needle type nozzle, it is possible to selectively blow the foreign substance F or the surroundings of the foreign substance F (for example, the surface of the Fabry-Perot interference filter portion 1A to which the foreign substance F adheres) with pinpoint precision. In this case, even when occurrence of abnormal operation of the solenoid valve 540 dramatically changes blow conditions, for example (such as when the air pressure suddenly becomes high, for example), it would be possible to limit a range of influence and minimize the damage to the entire wafer 100.

Next, results of an evaluation of characteristics of the Fabry-Perot interference filter before and after the air blow performed by the present inventors will be described with reference to FIGS. 15 and 16. The evaluation of characteristics was performed by applying air blow by the above-described blow nozzle 530 on the membrane portion of the Fabry-Perot interference filter in excess of the amount required for normal foreign substance removal, and by comparing the characteristics of the Fabry-Perot interference filter before and after the air blow. Note that although the evaluation of characteristics was performed on the Fabry-Perot interference filter 1 singulated by cutting the wafer 100 along each of the lines 5, similar results are considered to be obtained in a case where air blow is performed on the Fabry-Perot interference filter portion 1A on the wafer 100.

The main measurement conditions and procedures are as follows.

<Measurement Conditions>
 Blow nozzle type: Needle type
 Blow nozzle syringe capacity: 10 ml
 Pressure of air discharged from blow nozzle: 0.5 MPa
 Length of time of blow: 1 ms
 Distance between the tip of the blow nozzle (tip of the needle) and the membrane portion surface of the Fabry-Perot interference filter: 1 cm or less <Experiment Procedure>
 1. Under normal temperature environment, a sample (Fabry-Perot interference filter 1) was set on a stage of a characteristic evaluation device.
 2. Characteristics (peak transmission wavelength for the filter control voltage and wavelength resolution for the peak transmission wavelength) before air blow were measured.
 3. The sample was removed, and air blow based on the above measurement conditions was applied to the sample.
 4. Under normal temperature environment, the sample was set on the stage again.
 5. Characteristics (peak transmission wavelength for the filter control voltage and wavelength resolution for the peak transmission wavelength) after the air blow were measured.

Figure 15:
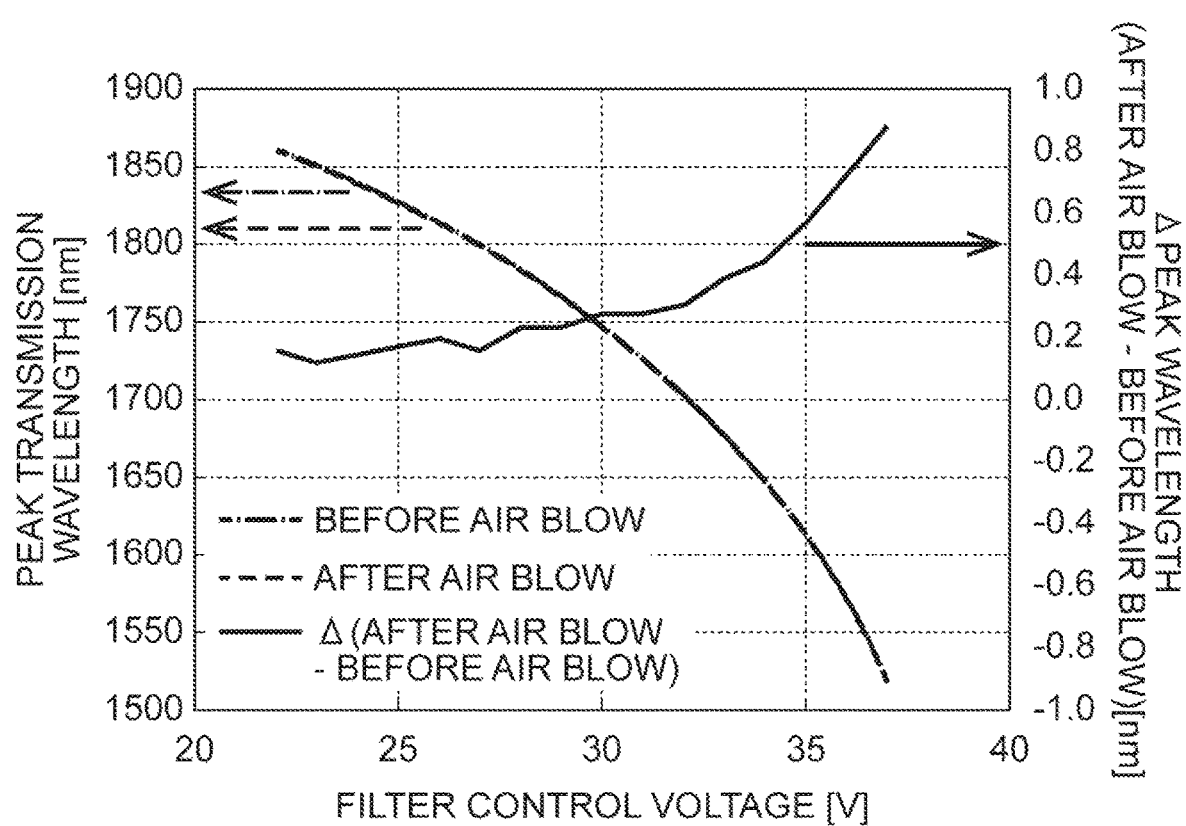
FIG. 15 is a graph illustrating comparison results of characteristics (peak transmission wavelength with respect to a filter control voltage) of a Fabry-Perot interference filter before and after air blow.

FIG. 15 illustrates a relationship between a filter control voltage (that is, a voltage between the first electrode 12 and the third electrode 14) and a peak transmission wavelength (a wavelength having highest transmittance for the light transmission region 1a). As illustrated in FIG. 15, the maximum deviation (absolute value) of the peak transmission wavelength before and after air blow was about 0.9 nm. This deviation is highly likely to be caused by the removal of the sample from the stage once performed for air blow and by errors due to the measurement environment. Therefore, it is possible to determine that the deviation is a tolerable error and that the air blow has had substantially no effect on the characteristics of the Fabry-Perot interference filter (relationship between the peak transmission wavelength and the filter control voltage).

Figure 16:
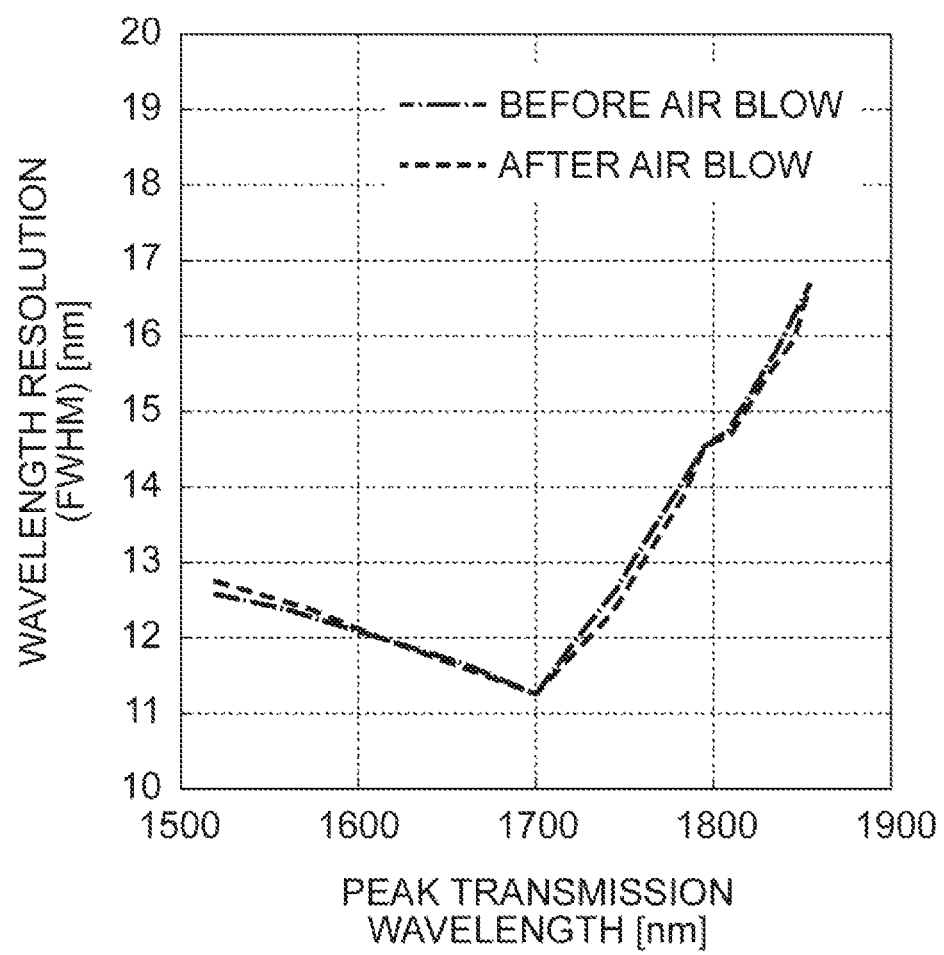
FIG. 16 is a graph illustrating comparison results of characteristics (wavelength resolution with respect to peak transmission wavelength) of a Fabry-Perot interference filter before and after air blow.

FIG. 16 illustrates a relationship between the peak transmission wavelength and the wavelength resolution (FWHM). As illustrated in FIG. 16, the difference in the wavelength resolution at the same peak transmission wavelength before and after air blowing was about 0.3 nm at the maximum. That is, it was confirmed that the characteristics (relationship of the wavelength resolution with respect to the peak transmission wavelength) of the Fabry-Perot interference filter has substantially no change (level within a sufficiently tolerable error range) due to the air blow to the membrane portion of the Fabry-Perot interference filter.

[Method of Manufacturing Fabry-Perot Interference Filter]

Figure 17:
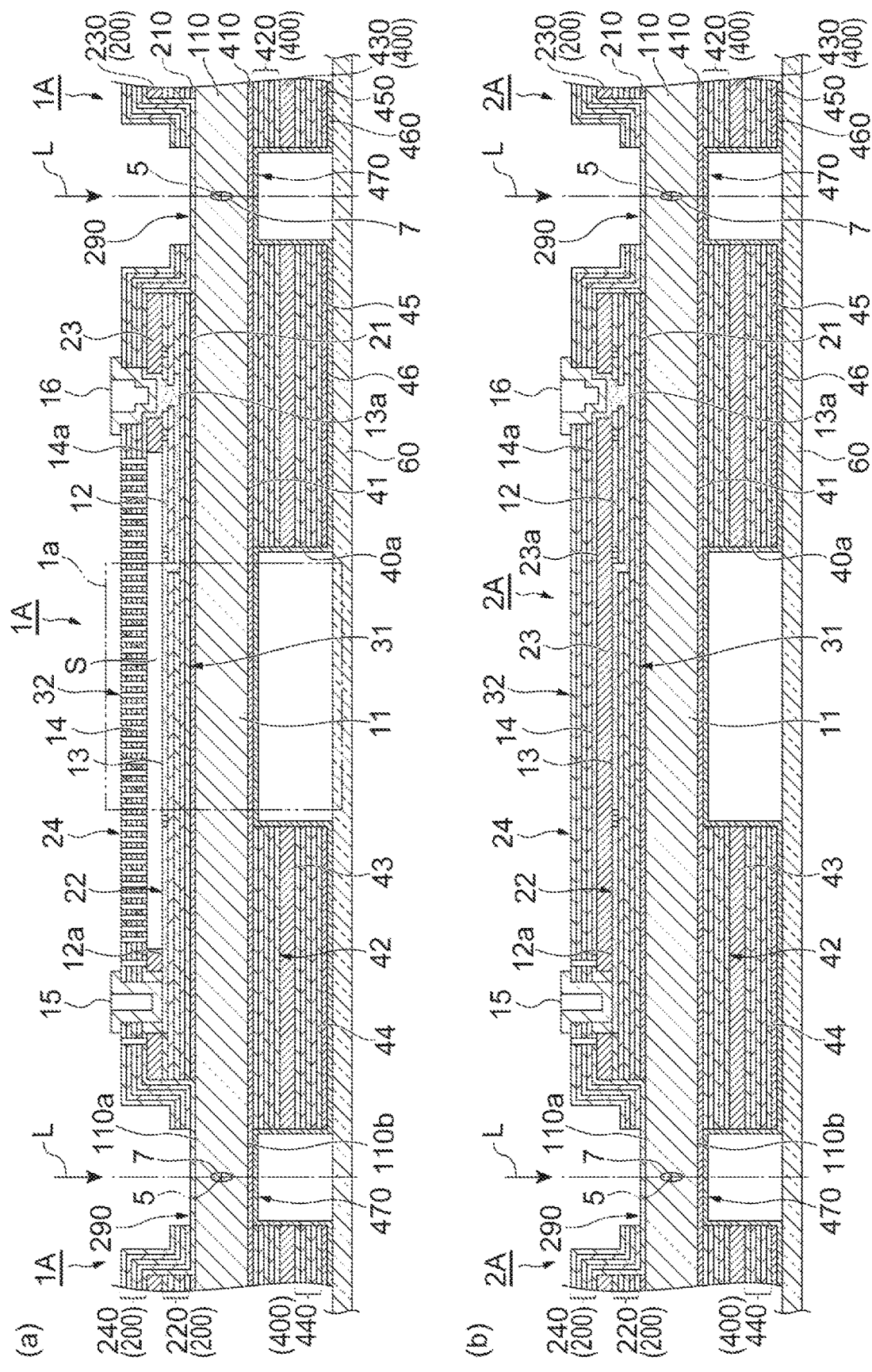
FIG. 17 is a cross-sectional view illustrating a method for cutting out a Fabry-Perot interference filter from the wafer illustrated in FIG. 5.
Figure 18:
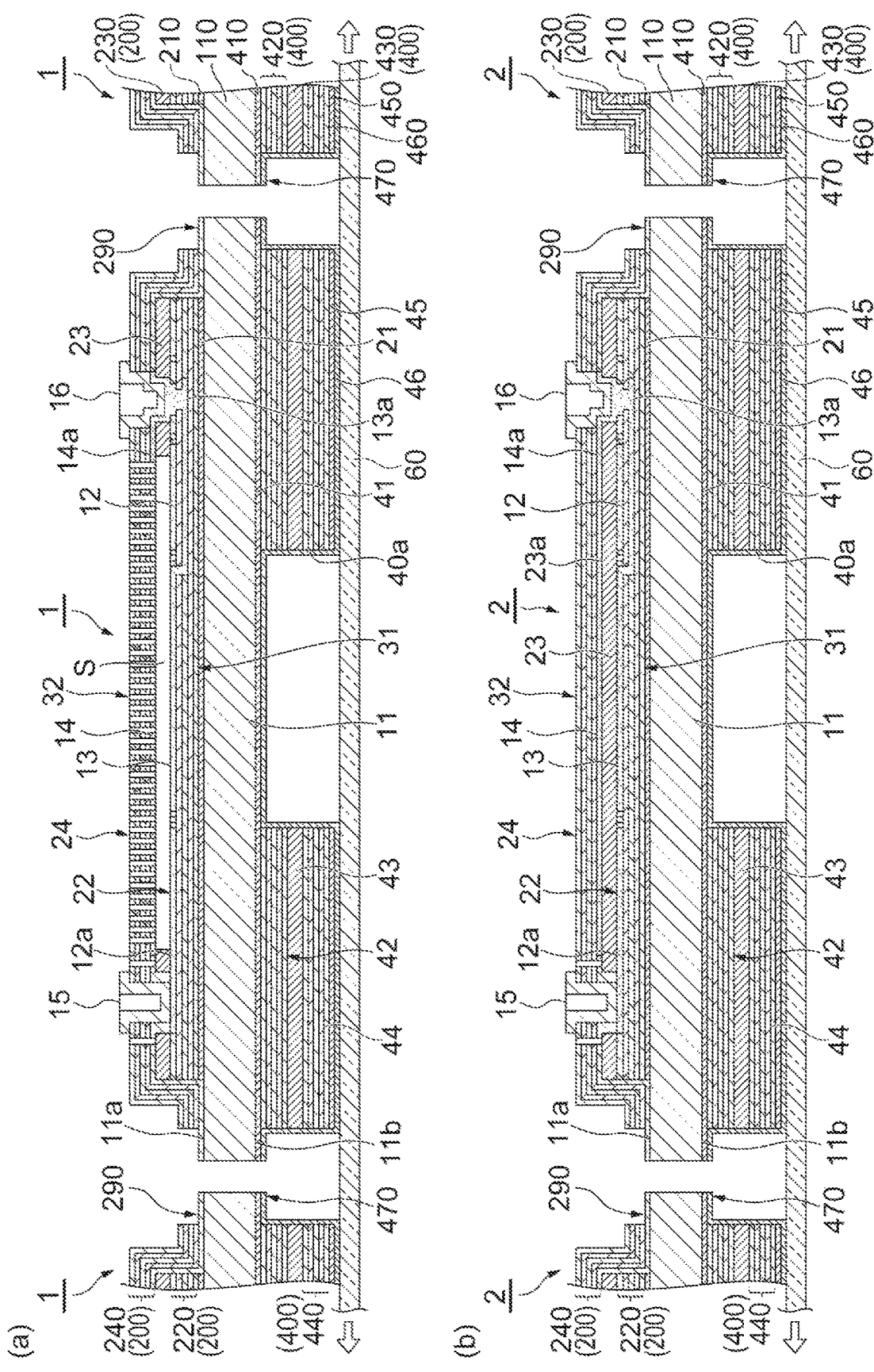
FIG. 18 is a cross-sectional view illustrating a method for cutting out a Fabry-Perot interference filter from the wafer illustrated in FIG. 5.

Next, a method for cutting out the Fabry-Perot interference filter 1 from the wafer 100 (a method of manufacturing the Fabry-Perot interference filter 1) will be described with reference to FIGS. 17 and 18. In FIGS. 17 and 18, (a) is cross-sectional view of a portion corresponding to the Fabry-Perot interference filter portion 1A, and (b) is a cross-sectional view of a portion corresponding to the dummy filter portion 2A.

First, as illustrated in FIG. 17, an expanding tape 60 is attached onto the protective layer 460 (that is, to the second surface 110b side). Subsequently, laser light L is applied from a side opposite to the expanding tape 60 in a state where the expanding tape 60 is attached to the second surface 110b side, and then a converging point of the laser light L is relatively moved along each of the lines 5 while a converging point of the laser light L is positioned within the substrate layer 110. That is, the laser light L is controlled to be incident on the substrate layer 110 from the side opposite to the expanding tape 60 through the surface of the polysilicon layer exposed in the first groove 290.

With the irradiation of the laser light L, a modified region 7 is formed within the substrate layer 110 along each of the lines 5. The modified region 7 is a region having physical characteristics such as density, a refractive index, mechanical strength different from those in the surrounding area, and is a region to be a start point of a fracture extending in a thickness direction of the substrate layer 110. Examples of the modified region 7 include molten processed regions (which means at least any one of a region resolidified after melting, a region in a melted state, and a region in a state of being resolidified from the melted state), a crack region, a dielectric breakdown region, a refractive index changed region, or the like, or a mixed region of these. Further examples of the modified region 7 include a region where the density of the modified region 7 has changed from that of an unmodified region, a region with a lattice defect, or the like, in the material of the substrate layer 110. When the material of the substrate layer 110 is monocrystalline silicon, the modified region 7 can also be defined as a high-dislocation density region. The number of rows of the modified regions 7 arranged in the thickness direction of the substrate layer 110 with respect to each of the lines 5 is appropriately adjusted on the basis of the thickness of the substrate layer 110.

Subsequently, as illustrated in FIG. 18, the expanding tape 60 attached to the second surface 110b side is expanded so as to extend the fracture in the thickness direction of the substrate layer 110 from the modified region 7 formed within the substrate layer 110, and then, the substrate layer 110 is cut into the plurality of substrates 11 along each of the lines 5. At this time, the polysilicon layer of the second mirror layer 240 is cut along each of the lines 5 in the first groove 290, while the reflection prevention layer 410 and the protective layer 460 are cut along each of the lines 5 in the second groove 470. With this procedure, a plurality of Fabry-Perot interference filters 1 and the plurality of dummy filters 2 in a state of being separated from each other on the expanding tape 60 are obtained.

Configuration of Light Detection Device of First Embodiment

Figure 19:
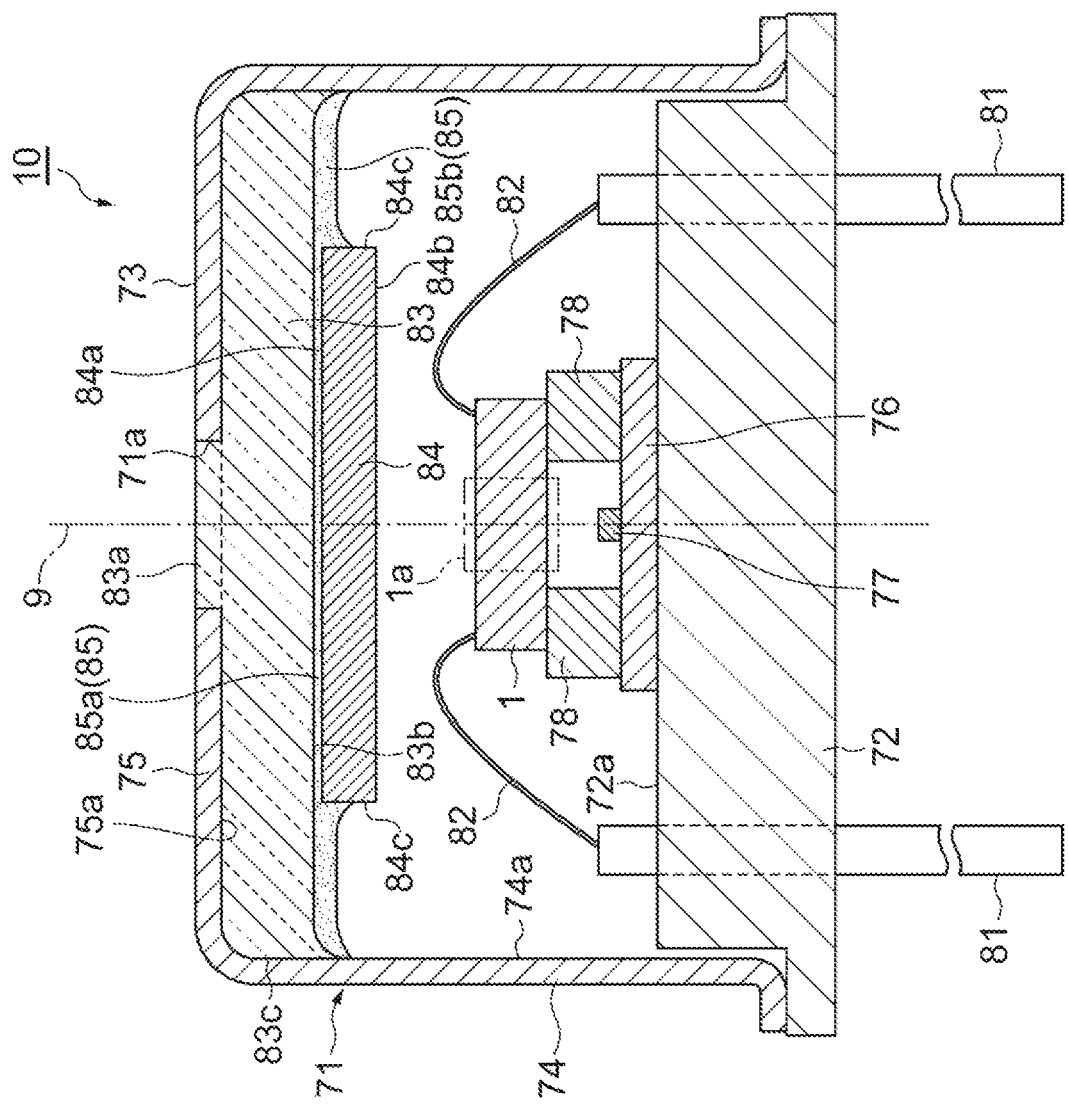
FIG. 19 is a cross-sectional view of a light detection device of a first embodiment.

Next, a configuration of a light detection device 10 of a first embodiment including the Fabry-Perot interference filter 1 will be described. As illustrated in FIG. 19, the light detection device 10 includes a package 71. The package 71 is a CAN package including a stein 72 and a cap 73. The cap 73 is integrally formed by a side wall 74 and a top wall 75. The stein 72 and the cap 73 are formed of a metal material and are hermetically joined to each other. In the package 71 formed of a metal material, the shape of the side wall 74 is cylindrical about a line 9 as a center line. The stein 72 and the top wall 75 face each other in a direction parallel to the line 9, and close both ends of the side wall 74, individually.

A wiring substrate 76 is secured to an inner surface 72a of the stein 72. Examples of a material applicable as the wiring substrate 76 include silicon, ceramic, quartz, glass, plastic, or the like. The light detector (light detection unit) 77 and a temperature detector (not illustrated) such as a thermistor are mounted on the wiring substrate 76. The light detector 77 is disposed on the line 9. More specifically, the light detector 77 is disposed such that the center line of a light receiving portion thereof is aligned with the line 9. The light detector 77 is an infrared detector such as a quantum type sensor using InGaAs or other compounds or a thermal type sensor using a thermopile or a bolometer or the like. In a case of detecting light of different wavelength bands of ultraviolet, visible, and near infrared regions, for example a silicon photodiode or the like can be used as the light detector 77. Note that the light detector 77 may include one light receiving portion, or a plurality of light receiving portions provided in an array. Furthermore, a plurality of light detectors 77 may be mounted on the wiring substrate 76. The temperature detector may be disposed at a position close to the Fabry-Perot interference filter 1, for example, so that a temperature change of the Fabry-Perot interference filter 1 can be detected.

A plurality of spacers 78 is secured onto the wiring substrate 76. Examples of a material applicable as the spacers 78 include silicon, ceramic, quartz, glass, plastic, or the like. The Fabry-Perot interference filter 1 is secured onto the plurality of spacers 78 by adhesive, for example. Fabry-Perot interference filter 1 is disposed on the line 9. More specifically, the Fabry-Perot interference filter 1 is disposed such that the center line of the light transmission region 1a is aligned with the line 9. Note that the spacers 78 may be integrally formed with the wiring substrate 76. The Fabry-Perot interference filter 1 may be supported by a single spacer 78, rather than by the plurality of spacers 78.

A plurality of lead pins 81 is secured to the stein 72. More specifically, each of the lead pins 81 penetrates through the stein 72 in a state where electrical insulation and hermeticity with the stein 72 are maintained. Each of the lead pins 81 is electrically connected by wires 82 to each of electrode pads provided on the wiring substrate 76, a terminal of the light detector 77, a terminal of the temperature detector, and a terminal of the Fabry-Perot interference filter 1. The light detector 77, the temperature detector, and the Fabry-Perot interference filter 1 may be electrically connected to each of the lead pins 81 via the wiring substrate 76. For example, each of terminals may be electrically connected to an electrode pad provided on the wiring substrate 76, while the electrode pad and each of the lead pins 81 may be connected by the wire 82. This enables input and output of electric signals to and from each of the light detector 77, the temperature detector, and the Fabry-Perot interference filter 1.

The package 71 has an opening 71a. More specifically, the opening 71a is formed in the top wall 75 of the cap 73 such that the center line thereof is aligned with the line 9. The shape of the opening 71a is circular when viewed in a direction parallel to the line 9. A light transmitting member 83 is disposed on an inner surface 75a of the top wall 75 so as to close the opening 71a. The light transmitting member 83 is hermetically joined to the inner surface 75a of the top wall 75. The light transmitting member 83 has a light incident surface 83a and a light emission surface 83b (inner surface) opposite to the light incident surface 83 in a direction parallel to line 9, and has side surfaces 83c. The light incident surface 83a of the light transmitting member 83 is substantially flush with an outer surface of the top wall 75 at the opening 71a. The side surface 83c of the light transmitting member 83 is in contact with an inner surface 74a of the side wall 74 of the package 71. That is, the light transmitting member 83 reaches the inside of the opening 71a and the inner surface 74a of the side wall 74. Such a light transmitting member 83 is formed by disposing a glass pellet inside the cap 73 with the opening 71a facing down and melting the glass pellet. That is, the light transmitting member 83 is formed of fused glass.

A band pass filter 84 is secured to the light emission surface 83b of the light transmitting member 83 by a bonding member 85. That is, the bonding member 85 secures the band pass filter 84 to the inner surface 75a of the top wall 75 via the light transmitting member 83 joined to the inner surface 75a of the top wall 75. The band pass filter 84 selectively transmits light with a measurement wavelength range by the light detection device 10 (light with a predetermined wavelength range and should be incident on the light transmission region 1a of the Fabry-Perot interference filter 1) out of light transmitted through the light transmitting member 83 (that is, the band pass filter 84 transmits only the light with the wavelength range). The band pass filter 84 has a rectangular plate shape. More specifically, the band pass filter 84 has a light incident surface 84a and a light emission surface 84b opposite to the light incident surface 84 in a direction parallel to the line 9, and has four side surfaces 84c. The band pass filter 84 is obtained by forming a dielectric multilayer film (for example, a multilayer film combining a high refractive material such as $TiO_2$ and $Ta_2O_5$ and a low refractive material such as $SiO_2$ and $MgF_2$) on a surface of a light transmitting member formed in a rectangular shape using a light transmitting material (for example, silicon, glass, or the like).

The bonding member 85 includes a first portion 85a arranged over the entire region of the light incident surface 84a of the band pass filter 84. That is, the first portion 85a in the bonding member 85 is a portion arranged between the light emission surface 83b of the light transmitting member 83 and the light incident surface 84a of the band pass filter 84 facing each other. The bonding member 85 further includes a second portion 85b protruding outward from the outer edge of the band pass filter 84 when viewed in a direction parallel to the line 9. The second portion 85b reaches the inner surface 74a of the side wall 74 and is in contact with the inner surface 74a of the side wall 74. Furthermore, the second portion 85b is in contact with the side surface 84c of the band pass filter 84.

In the light detection device 10 configured as described above, when light is incident on the band pass filter 84 from outside via the opening 71a, the light transmitting member 83, and the bonding member 85, light with a predetermined wavelength range is selectively transmitted. When the light transmitted through the band pass filter 84 is incident on the light transmission region 1a of the Fabry-Perot interference filter 1, light with a predetermined wavelength out of the light with the predetermined wavelength range is selectively transmitted. The light transmitted by the light transmission region 1a of the Fabry-Perot interference filter 1 is incident on the light receiving portion of the light detector 77 and is detected by the light detector 77. That is, the light detector 77 converts the light transmitted through the Fabry-Perot interference filter 1 into an electric signal and outputs the electric signal. For example, the light detector 77 outputs an electric signal of a strength corresponding to the intensity of the light incident on the light receiving portion.

Method for Manufacturing Light Detection Device of First Embodiment

Figure 20:
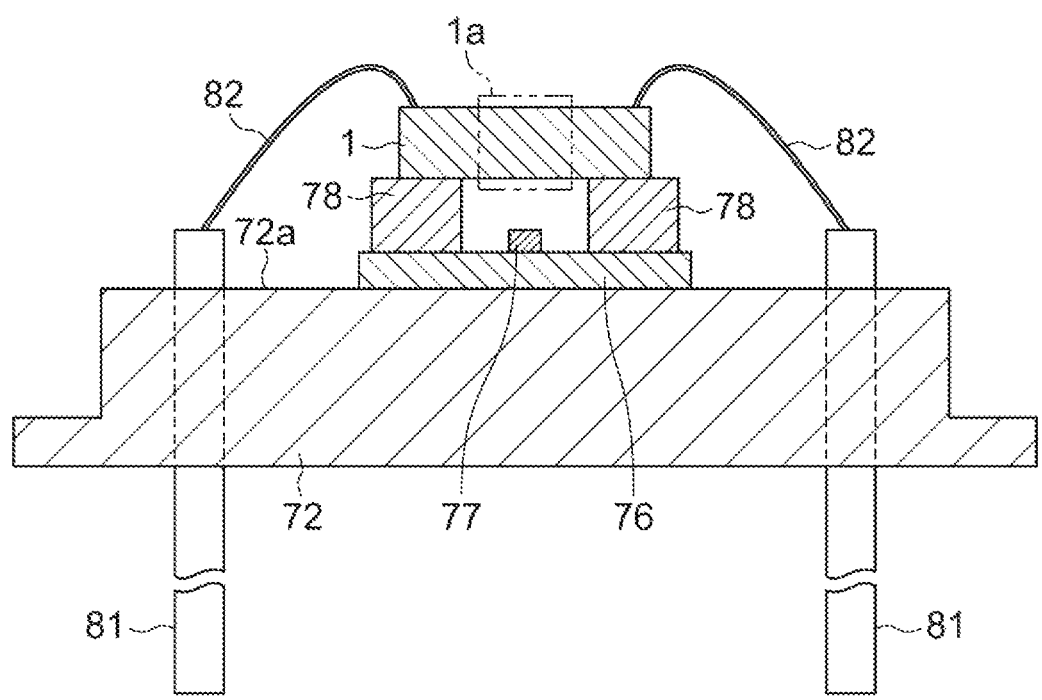
FIG. 20 is a cross-sectional view illustrating a method for manufacturing the light detection device illustrated in FIG. 19.

Next, a method for manufacturing the light detection device 10 will be described. As illustrated in FIG. 20, first, a stein 72 to which the Fabry-Perot interference filter 1 and the light detector 77 are secured is prepared. Specifically, part of the light detection device 10 in a state immediately before the cap 73 is attached is prepared. For example, one or a plurality of the stems 72 are mounted on a stage (not illustrated) for performing the above-described appearance inspection and air blow.

Subsequently, using a method similar to the method of the appearance inspection performed by the inspection device 500 described above, a foreign substance F adhering to the surface 24a of the second laminate 24 opposite to the first laminate 22 on the Fabry-Perot interference filter 1 secured to the stein 72 is detected. Subsequently, using a method similar to the method of the air blow performed by the inspection device 500 described above, air in which the airflow peak position is adjusted on the basis of the position of the detected foreign substance F is blown onto the surface 24a of the second laminate 24. This operation removes the foreign substance F from the surface 24a of the second laminate 24. Subsequently, after the foreign substance F is removed as described above, the cap 73 is joined to the stein 72 to which the Fabry-Perot interference filter 1 and the light detector 77 are secured. With the above procedure, the light detection device 10 illustrated in FIG. 19 is obtained. In a case where a plurality of the stems 72 is mounted on the stage, it is possible to collectively perform air blow to the plurality of Fabry-Perot interference filters 1 secured to the plurality of stems 72 by using an air blow gun type nozzle capable of wide range blow as described above. Furthermore, it is preferable to perform the above-described air blow onto a portion other than the surface 24a of the second laminate 24 of the Fabry-Perot interference filter 1 so as to remove the foreign substance F adhering to the surface 24a from the surface 24a and discharge the foreign substance F out of the package.

Configuration of Light Detection Device of Second Embodiment

Figure 21:
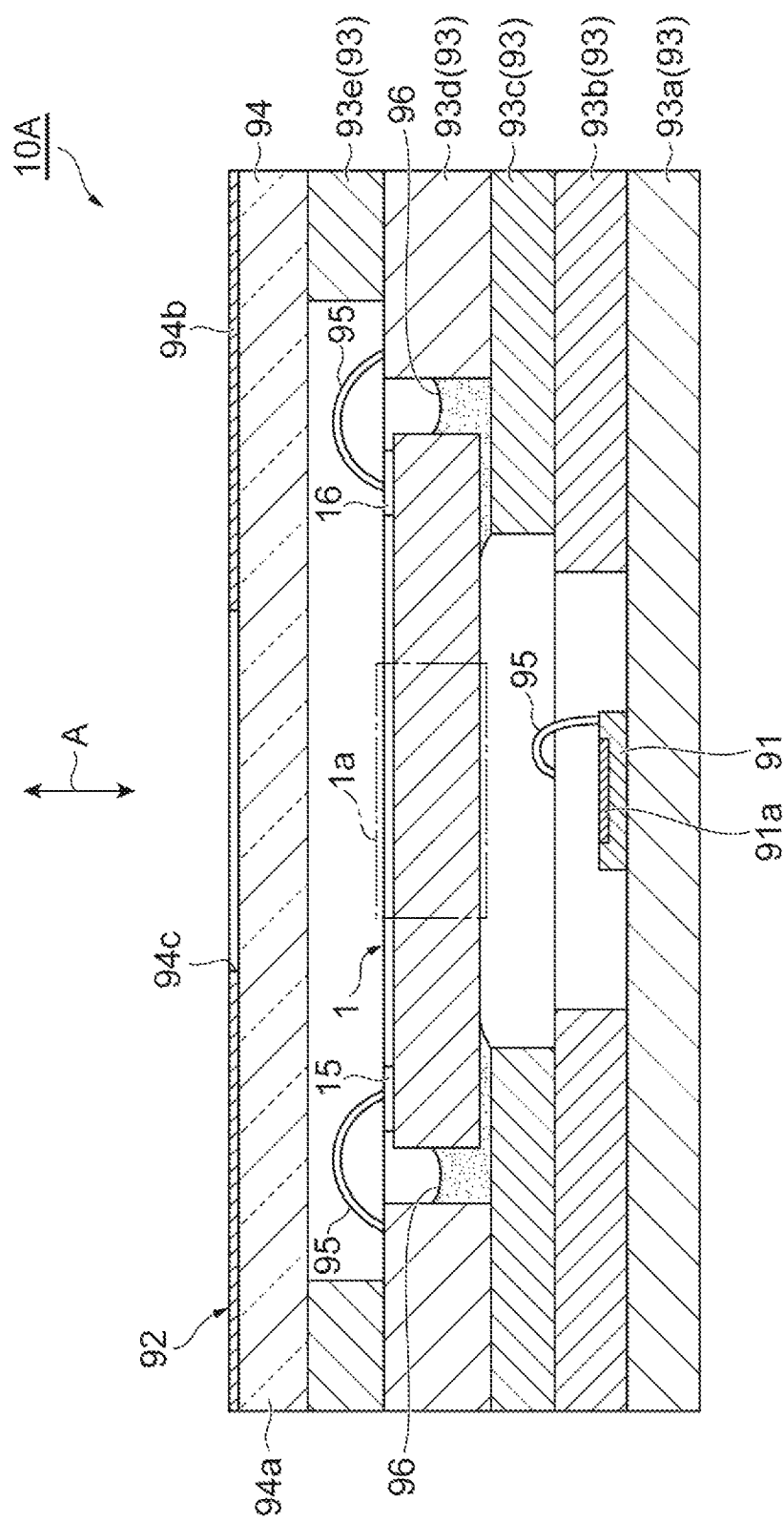
FIG. 21 is a cross-sectional view of a light detection device of a second embodiment.
Figure 22:
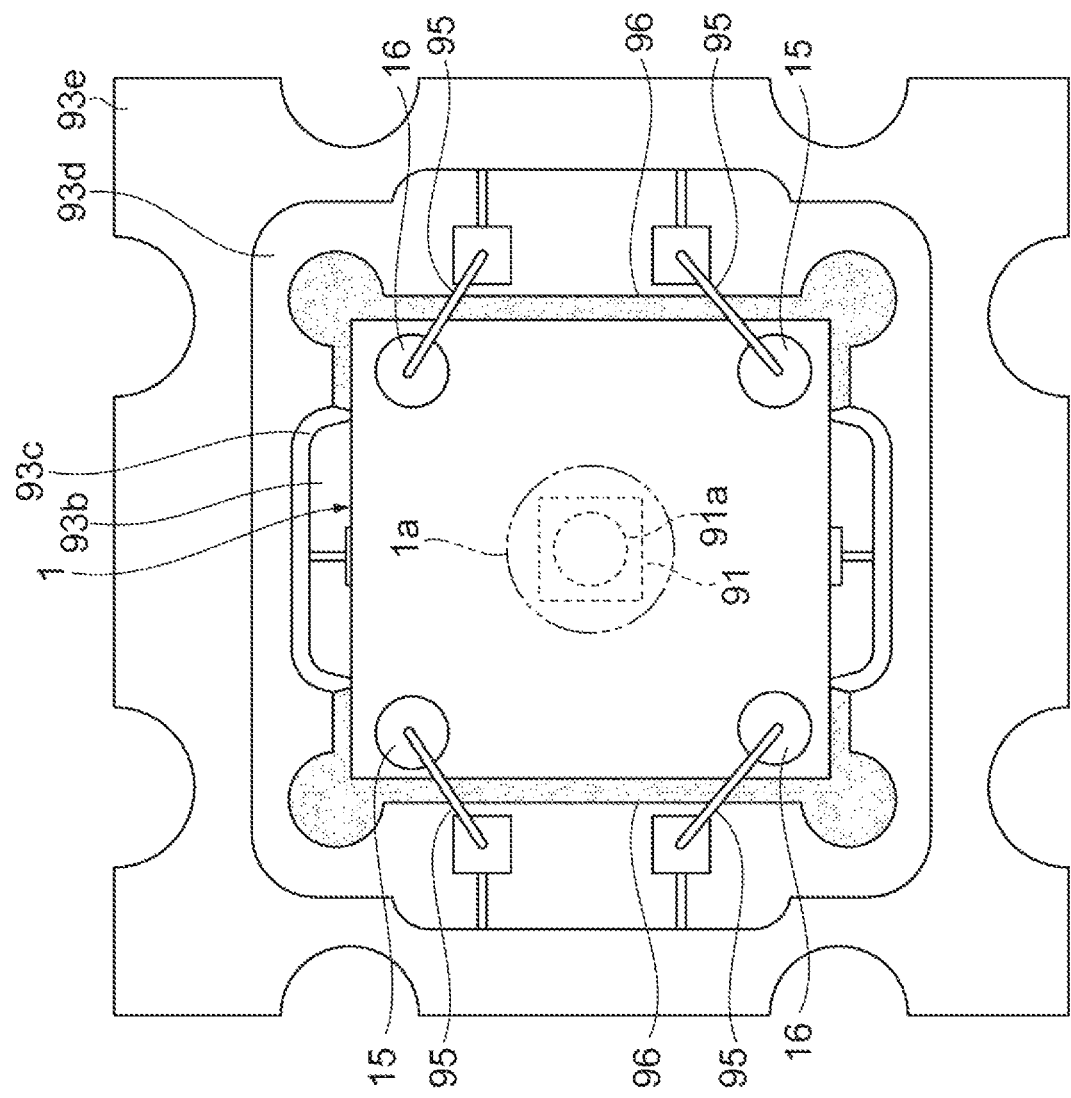
FIG. 22 is a plan view of the light detection device illustrated in FIG. 21.

Next, a configuration of a light detection device 10A according to a second embodiment including the Fabry-Perot interference filter 1 will be described with reference to FIGS. 21 and 22. FIG. 22 omits illustration of a lid substrate 94 or the like described below. As illustrated in FIGS. 21 and 22, the light detection device 10A is different from the above-described light detection device 10 in that the light detection device 10A is configured as a surface mount device (SMD). The light detection device 10A includes an SMD package 92 accommodating a light detector 91, a temperature compensation element (not illustrated), and the Fabry-Perot interference filter 1. The SMD package 92 includes: a support body 93 that supports the Fabry-Perot interference filter 1 and the light detector 91; and a lid substrate 94 that is joined to the support body 93. The support body 93 includes a first substrate 93a, a second substrate 93b, a third substrate 93c, a fourth substrate 93d, and a fifth substrate 93e.

The first substrate 93a, the second substrate 93b, the third substrate 93c, the fourth substrate 93d, the fifth substrate 93e, and the lid substrate 94 are laminated in this order. An opening is provided at a center portion of each of the second substrate 93b, the third substrate 93c, the fourth substrate 93d, and the fifth substrate 93e. When viewed in the lamination direction (direction A) of these substrates, the opening of the third substrate 93c includes the opening of the second substrate 93b. When viewed in the direction A, the opening of the fourth substrate 93d includes the opening of the third substrate 93c. When viewed in the direction A, the opening of the fifth substrate 93e includes the opening of the fourth substrate 93d. This allows part of each of surfaces of the first substrate 93a, the second substrate 93b, the third substrate 93c, and the fourth substrate 93d is exposed to the opening of the fifth substrate 93e.

A light detector 91 and a temperature compensation element (not illustrated) are mounted on an exposed front surface of the first substrate 93a. A plurality of electrode pads (not illustrated) is provided on the back surface of the first substrate 93a. Each of terminals of the light detector 91 and each of terminals of the temperature compensation element are electrically connected to the electrode pad via wiring provided on the first substrate 93a, a wire 95, or wiring provided on each of the substrates 93a and 93b.

The Fabry-Perot interference filter 1 is secured to the exposed front surface of the third substrate 93c by a bonding member 96. Upper surfaces of the terminals 15 and 16 of the Fabry-Perot interference filter 1 are at a height equivalent to the height of an upper surface of the fourth substrate 93d. Pads electrically connected to the electrode pads are provided on the upper surface of the fourth substrate 93d, and the terminals 15 and 16 are connected to the pads on the upper surface of the fourth substrate 93d via wires 95. The terminals 15 and 16 of the Fabry-Perot interference filter 1 are electrically connected to the electrode pads via wires 95 and wiring provided on the substrates 93a, 93b, 93c, and 93d. The third substrate 93c functions as a support member that supports the Fabry-Perot interference filter 1 on the first substrate 93a and the second substrate 93b.

Examples of applicable materials of the first substrate 93a, the second substrate 93b, the third substrate 93c, the fourth substrate 93d, and the fifth substrate 93e include ceramic, resin, and the like. In particular, in order to reduce the difference in thermal expansion coefficient between the Fabry-Perot interference filter 1 and the third substrate 93c, the material of the third substrate 93c has preferably a thermal expansion coefficient equivalent to the material of the Fabry-Perot interference filter 1.

Examples of applicable materials of the bonding member 96 for bonding the Fabry-Perot interference filter 1 with the third substrate 93c include flexible resin materials (for example, a resin material such as a silicone-based, urethane-based, epoxy-based, acrylic-based, or hybrid resin material, either conductive or non-conductive). The resin material is preferably selected from materials having a Young's modulus of less than 1000 MPa, and more preferably selected from materials having a Young's modulus of less than 10 MPa. Furthermore, the resin material is preferably selected from materials having a glass transition temperature outside the operating temperature of the light detection device 10A. For example, with the use of an adhesive containing a silicone-based resin material as the material of the bonding member 96, the Young's modulus after curing becomes less than 10 MPa, leading to the glass transition temperature −50° C. to −40° C. which is lower than the operating temperature (for example, about 5° C. to 40° C.).

Here, the elastic modulus of the bonding member 96 for bonding the Fabry-Perot interference filter 1 with the third substrate 93c is lower than the elastic modulus of the third substrate 93c. The elastic modulus of the bonding member 96 is lower than the elastic modulus of a bonding member (not illustrated) that bonds the first substrate 93a, the second substrate 93b, the third substrate 93c, the fourth substrate 93d, the fifth substrate 93e, and the lid substrate 94 to each other. For example, with the use of an adhesive containing an epoxy-based resin material for the material of the bonding member for bonding the first substrate 93a, the second substrate 93b, the third substrate 93c, the fourth substrate 93d, the fifth substrate 93e, and the lid substrate 94 to each other, the Young's modulus after curing will be 100 MPa or more.

The lid substrate 94 includes a light transmitting substrate 94a and a light shielding layer 94b. The light transmitting substrate 94a is secured onto the fifth substrate 93e by a bonding member (not illustrated). Example of a material applicable as the light transmitting substrate 94a include materials (for example, glass, silicon, germanium, or the like) corresponding to the measurement wavelength range of the light detection device 10A. The light shielding layer 94b is formed on the front surface of the light transmitting substrate 94a. Examples of a material applicable as the light shielding layer 94b include light shielding materials or light absorbing materials (for example, a metal such as aluminum, a metal oxide such as chromium oxide, or a black resin, or the like). An opening 94c is provided in the light shielding layer 94b. The light transmission region 1a and the opening 94c face each other in the direction A. Note that the light shielding layer 94b may be formed on the back surface of the light transmitting substrate 94a. Furthermore, a light reflection prevention layer may be formed on at least one of the front surface or the back surface of the light transmitting substrate 94a. Furthermore, a band pass filter that selectively transmits light in the measurement wavelength range may be used as the light transmitting substrate 94a.

In the light detection device 10A configured as described above, after light is incident in the light transmission region 1a of the Fabry-Perot interference filter 1 from the outside via the opening 94c and the light transmitting substrate 94a, light having a predetermined wavelength is selectively transmitted in accordance with a distance between the first mirror portion 31 (refer to FIG. 3) and the second mirror portion 32 (refer to FIG. 3) in the light transmission region 1a. The light transmitted through the first mirror portion 31 and the second mirror portion 32 is incident onto a light receiving portion 91a of the light detector 91 and is detected by the light detector 91. In the light detection device 10A, an spectroscopic spectrum can be obtained by detection of light transmitted through the first mirror portion 31 and the second mirror portion 32 using the light detector 91 while the voltage applied to the Fabry-Perot interference filter 1 is changed (that is, while the distance between the first mirror portion 31 and the second mirror portion 32 is changed).

Method for Manufacturing Light Detection Device of Second Embodiment

Figure 23:
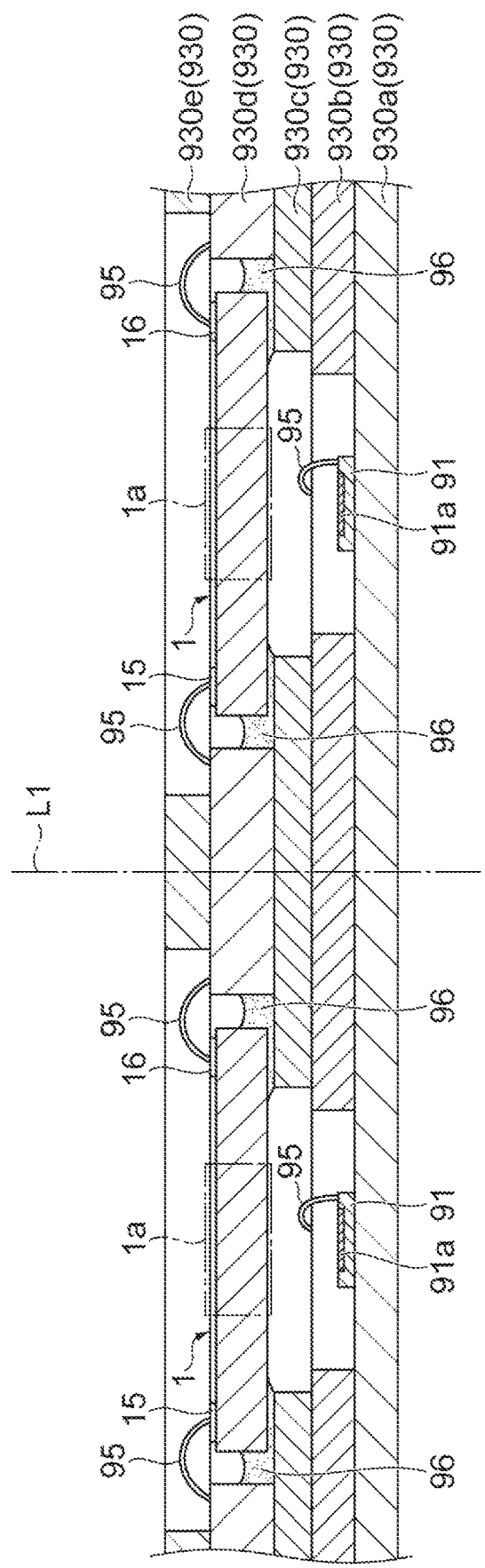
FIG. 23 is a cross-sectional view illustrating a method for manufacturing the light detection device illustrated in FIG. 21.

Next, a method for manufacturing the light detection device 10A will be described. As illustrated in FIG. 23, first, a plurality of Fabry-Perot interference filters 1 arranged one-dimensionally or two-dimensionally, and a plurality of light detectors 91 provided corresponding to the plurality of Fabry-Perot interference filters 1, and a support layer 930 that supports the plurality of Fabry-Perot interference filters 1 and the plurality of light detectors 91 are prepared. The support layer 930 includes a first substrate layer 930a, a second substrate layer 930b, a third substrate layer 930c, a fourth substrate layer 930d, and a fifth substrate layer 930e each respectively to be each of a plurality of layers, namely, the first substrate 93a, the second substrate 93b, the third substrate 93c, the fourth substrate 93d, and the fifth substrate 93e, after the individual layers are cut along a cutting line L1.

Subsequently, using a method similar to the method of the appearance inspection performed by the inspection device 500 described above, a foreign substance F adhering to the surface 24a of the second laminate 24 opposite to the first laminate 22 is detected for each of the plurality of Fabry-Perot interference filters 1 supported by the support layer 930. Subsequently, using a method similar to the method of the air blow performed by the inspection device 500 described above, air in which the airflow peak position is adjusted on the basis of the position of the detected foreign substance F is blown onto the surface 24a of the second laminate 24. With this procedure, the foreign substance F is removed from the surface 24a of the second laminate 24 of the Fabry-Perot interference filter 1 where the foreign substance F has been detected.

Figure 24:
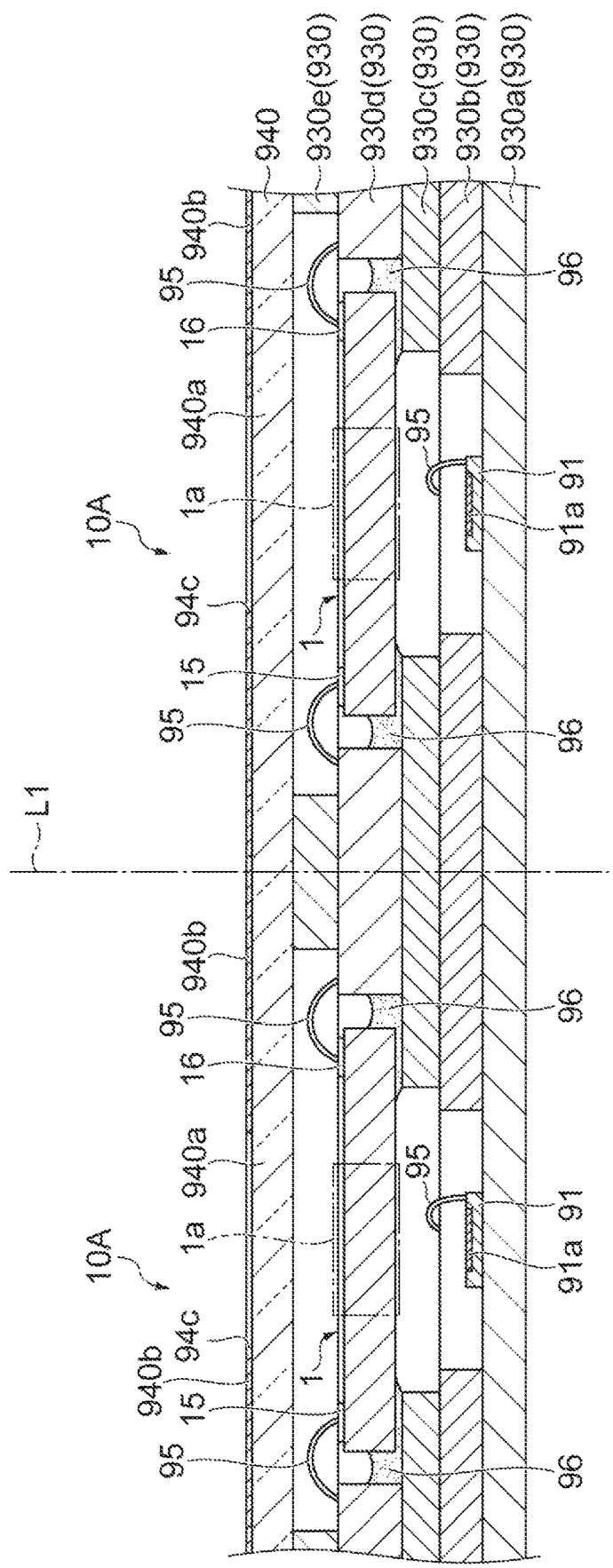
FIG. 24 is a cross-sectional view illustrating a method for manufacturing the light detection device illustrated in FIG. 21.

Subsequently, after the foreign substance F is removed from each of the plurality of Fabry-Perot interference filters 1 supported by the support layer 930 as described above, a lid substrate layer 940 having a plurality of openings 94c formed corresponding to the plurality of Fabry-Perot interference filters 1 will be joined to the support layer 930 (here, an upper surface of the fifth substrate layer 930e) as illustrated in FIG. 24. Specifically, the lid substrate layer 940 is joined to the support layer 930 such that each of the plurality of openings 94c faces each of the plurality of Fabry-Perot interference filters 1 in the direction A. The lid substrate layer 940 is a layer to be the plurality of lid substrates 94 when the layer is cut along the cutting line L1. The lid substrate layer 940 includes a light transmitting substrate layer 940a and a light shielding layer 940b. The light transmitting substrate layer 940a is a layer to be a plurality of light transmitting substrates 94a when the lid substrate layer 940 is cut along the cutting line L1. The light shielding layer 940b is a layer to be a plurality of light shielding layers 94b when the lid substrate layer 940 is cut along the cutting line L1. By joining the lid substrate layer 940 to the support layer 930 as described above, it is possible to obtain the plurality of light detection devices 10A linked one-dimensionally or two-dimensionally at the cutting line L1.

Subsequently, a joining portion of the lid substrate layer 940 and the support layer 930 is cut along the cutting line L1. With this procedure, individual light detection devices 10A (refer to FIGS. 21 and 22) are obtained.

[Operation and Effect of Method for Removing a Foreign Substance and Method for Manufacturing a Light Detection Device]

The above-described method for removing a foreign substance includes: a step of preparing the Fabry-Perot interference filter 1; a step of detecting the foreign substance F adhering to the surface 24a of the second laminate 24 opposite to the first laminate 22; and a step of blowing air in which an airflow peak position is adjusted on the basis of the position of the detected foreign substance F onto the surface 24a of the second laminate 24 and thereby removing the foreign substance F from the surface 24a of the second laminate 24. When air blow is performed onto the wafer 100, the Fabry-Perot interference filter 1, the first laminate 22, and the second laminate 24 can be replaced, in description, with the Fabry-Perot interference filter portion 1A, the first mirror layer 220, and the second mirror layer 240, respectively.

With the application of the above-described method for removing a foreign substance, a foreign substance F adhering to the surface 24a of the second laminate 24 of the Fabry-Perot interference filter 1 can be detected, and the foreign substance F can be removed by blowing air. Since the airflow peak position of the air is adjusted on the basis of the position of the detected foreign substance F, the foreign substance F can be appropriately removed by blowing the air. As described above, according to the above-described method for removing a foreign substance, the foreign substance F adhering to the Fabry-Perot interference filter 1 can be effectively removed, and the Fabry-Perot interference filter 1 can be obtained with high yield.

Here, the Fabry-Perot interference filter 1 has the gap S formed between a portion of the first laminate 22 at least including the first mirror portion 31 and a portion of the second laminate 24 at least including the second mirror portion 32 facing each other. That is, the portion of the second laminate 24 overlapping with the gap S when viewed in the facing direction ("membrane portion") has a membrane structure, which makes this portion relatively vulnerable. This has discouraged attempts to remove a foreign substance using a method involving generation of a stress to be a load on the membrane portion and involving a concern of deformation or breakage in the membrane portion, and therefore, the Fabry-Perot interference filter 1 to which the foreign substance F adheres has often been treated as a faulty product. However, as a result of earnest and intensive research by the present inventors, it is confirmed that a method of blowing air is capable of removing the foreign substance F without affecting the characteristics of the Fabry-Perot interference filter 1 even though this is a method of generating stress in the membrane portion.

Moreover, in the step of removing a foreign substance F, the airflow peak position is adjusted to match the position of the foreign substance F. In this case, the airflow peak (that is, the portion where the air velocity is highest) directly hits the foreign substance F, so that the foreign substance F can be more reliably removed.

Furthermore, the plurality of through-holes 24b is formed from the surface 24a of the second laminate 24 to the gap S in a portion (membrane portion) of the second laminate 24 overlapping the gap when viewed in a direction in which the first mirror portion 31 and the second mirror portion 32 face each other. In the step of removing a foreign substance F, air is blown onto at least a region of the surface 24a of the second laminate 24 where the plurality of through-holes 24b is formed. In this case, the air blown to the surface 24a of the second laminate 24 can be introduced into the gap S via the plurality of through-holes 24b. The air that has entered the gap S is pushed out by air that newly enters the gap S, so as to be discharged toward the surface 24a of the second laminate 24 via the through-hole 24b that is different from the through-hole 24b used as a passage of the air that newly enters the gap S. In this manner, the foreign substance F adhering to the surface 24a of the second laminate 24 can be blown up by the air discharged to the outside from the gap S. This makes it possible to further effectively remove the foreign substance F adhering to the Fabry-Perot interference filter 1.

Furthermore, in the step of preparing a Fabry-Perot interference filter 1, the wafer 100 having the plurality of Fabry-Perot interference filters 1 two-dimensionally linked to each other is prepared, and the step of detecting a foreign substance F and the step of removing the foreign substance F may be performed on the Fabry-Perot interference filter (that is, the Fabry-Perot interference filter portion 1A) constituting the wafer 100. That is, foreign substance removal by air blow may be performed in the wafer stage. In this case, when the foreign substance F adheres to the Fabry-Perot interference filter portion 1A constituting the wafer 100, the foreign substance F can be removed by blowing air. With this configuration, in a case of inspecting each of the plurality of Fabry-Perot interference filter portions 1A constituting the wafer 100, it is possible to transfer the Fabry-Perot interference filter portion 1A from which the foreign substance F has been removed to a subsequent process as a non-faulty product without immediately making a determination of faulty on the Fabry-Perot interference filter portion 1A to which the foreign substance F has adhered. Therefore, it is possible to improve the yield of the Fabry-Perot interference filter 1. Note that in a case where air blow is performed on the wafer 100 in this manner, it is preferable to perform air blow over a relatively wide range so as to not only remove the foreign substance F from the surface of the Fabry-Perot interference filter portion 1A where the foreign substance F is discovered but also remove the foreign substance F from the whole surface of the wafer 100.

In the step of preparing a Fabry-Perot interference filter 1, singulated Fabry-Perot interference filters 1 may be prepared. That is, foreign substance removal by air blow may be performed in the chip stage. For example, in a case where foreign substance removal is performed by blowing air on a Fabry-Perot interference filter portion 1A constituting the wafer 100, the foreign substance F might scatter onto other Fabry-Perot interference filter portions 1A constituting the wafer 100 and might adversely affect the other Fabry-Perot interference filter portions 1A. In contrast, by performing foreign substance removal using air blow onto the Fabry-Perot interference filter 1 at a stage where the Fabry-Perot interference filter 1 is singulated as described above, it is possible to prevent occurrence of adverse effects to the other Fabry-Perot interference filter portions 1A as described above.

Furthermore, the method for manufacturing a light detection device according to the first embodiment described above is a method for manufacturing the light detection device 10 including: the package 71 having the cap 73 formed with the opening 71a through which light is incident and having the stein 72 joined to the cap 73; the Fabry-Perot interference filter 1 disposed in the package 71; and the light detector 77 arranged inside the package 71 so as to detect light transmitted through the Fabry-Perot interference filter 1. The manufacturing method includes: a step of preparing the stein 72 to which the Fabry-Perot interference filter 1 and the light detector 77 are secured; a step of detecting the foreign substance F adhering to the surface 24a of the second laminate 24 of the Fabry-Perot interference filter 1 secured to the stein 72; a step of blowing air in which an airflow peak position is adjusted on the basis of the position of the detected foreign substance F onto the surface 24a of the second laminate 24 and thereby removing the foreign substance F from the surface 24a of the second laminate 24; and a step of joining the cap 73 to the stein 72 after the step of removing the foreign substance F.

According to the method for manufacturing a light detection device of the first embodiment, it is possible to detect the foreign substance F adhering to the surface 24a of the second laminate 24 of the Fabry-Perot interference filter 1 and possible to remove the foreign substance F by air blow in a state where the Fabry-Perot interference filter 1 and the light detector 77 are secured to the stein 72. That is, it is possible to appropriately detect and remove the foreign substance F adhering to the Fabry-Perot interference filter 1 immediately before acquisition of the light detection device 10. Here, since the assembling work of the light detection device 10 is not always performed in a cleanroom with high cleanliness, the possibility of adhesion of the foreign substance F to the surface 24a of the Fabry-Perot interference filter 1 during the assembling work can be relatively high. According to the above-described manufacturing method, it is possible to remove the foreign substance F adhering to the Fabry-Perot interference filter 1 in the final stage of the manufacturing process of the light detection device 10 without significantly affecting the characteristics of the Fabry-Perot interference filter 1. This enables improvement of the yield of the light detection device 10, which is the final product, making it possible to obtain the light detection device 10 with high yield.

Furthermore, the method for manufacturing a light detection device according to the second embodiment is a method for manufacturing the light detection device 10A including: the SMD package 92 having the lid substrate 94 and the support body 93 joined to the lid substrate 94; the Fabry-Perot interference filter 1 disposed inside the SMD package 92; and the light detector 91 disposed in the SMD package 92 so as to detect light transmitted through the Fabry-Perot interference filter 1. The manufacturing method includes: a step of preparing the plurality of Fabry-Perot interference filters 1 arranged one-dimensionally or two-dimensionally, the plurality of light detectors 91 provided corresponding to the plurality of Fabry-Perot interference filters 1, and the support layer 930 that supports the plurality of Fabry-Perot interference filters 1 and the plurality of light detectors 91 and that is to be cut into the plurality of support bodies 93; a step of detecting the foreign substance F adhering to the surface 24a of the second laminate 24 for each of the plurality of Fabry-Perot interference filters 1; a step of blowing air in which an airflow peak position is adjusted on the basis of the position of the detected foreign substance F to the surface 24a of the second laminate 24 and thereby removing the foreign substance F from the surface 24a of the second laminate 24; a step of joining the lid substrate layer 940 that is to be cut into the plurality of lid substrates 94 to the support layer 930 after the step of removing a foreign substance F and thereby obtaining the plurality of the light detection devices 10A one-dimensionally or two-dimensionally linked to each other; and a step of cutting a portion at which the lid substrate layer 940 and the support layer 930 are joined and thereby obtaining individual light detection devices 10A.

According to the method for manufacturing a light detection device of the second embodiment, it is possible to detect the foreign substance F adhering to the surface 24a of the second laminate 24 of each of the Fabry-Perot interference filters 1 and possible to remove the foreign substance F by air blow in a state where the plurality of the Fabry-Perot interference filters 1 is supported by the support layer 930. That is, it is possible to appropriately perform the detection and removal of the foreign substance F adhering to each of the Fabry-Perot interference filters 1 in a state immediately before acquisition of the light detection device 10A (specifically, a state immediately before enclosure of the space in which each Fabry-Perot interference filter 1 is housed by joining the lid substrate layer 940 to the support layer 930). Therefore, according to the present manufacturing method, the effects similar to those of the above-described method for manufacturing the light detection device 10 may be obtained.

Moreover, in the step of obtaining the plurality of light detection devices 10A, the lid substrate layer 940 having the plurality of openings 94c formed in advance is joined to the support layer 930 such that each of the plurality of openings 94c faces each of the plurality of Fabry-Perot interference filters 1. In this manner, by using a lid substrate layer 940 having the plurality of openings 94c formed in advance, it is possible to obtain the light detection device 10A having the opening 94c for allowing incidence of light formed in the lid substrate 94 immediately after cutting the lid substrate layer 940 and the support layer 930. This makes it possible to omit a step for forming the opening 94c in the lid substrate 94 of each of the light detection devices 10A after the cutting.

In the wafer 100, the plurality of Fabry-Perot interference filter portions 1A to be the plurality of Fabry-Perot interference filters 1 is provided in the effective area 101. In addition, the plurality of dummy filter portions 2A is provided in the dummy area 102 provided along the outer edge 110c of the substrate layer 110 to surround the effective area 101, and the intermediate layer 23 is provided between the first mirror portion 31 and the second mirror portion 32 facing each other in each of the dummy filter portions 2A. This configuration sufficiently ensures the strength of the entire wafer 100. This facilitates handling of the wafer 100 when the above-described inspection method is implemented on each of Fabry-Perot interference filter portions 1A. Furthermore, since warpage of the wafer 100 can be suppressed, it is possible to perform inspection of each of the Fabry-Perot interference filter portions 1A and air blow to the Fabry-Perot interference filter portion 1A in which a foreign substance is detected, with high accuracy.

Moreover, according to the method for manufacturing the wafer 100, the gap S is formed in each of the Fabry-Perot interference filter portions 1A while the plurality of Fabry-Perot interference filter portions 1A is still in the state of the wafer 100. Accordingly, compared to a case of forming the gap S individually at a chip level, it is possible to form the gap S between the first mirror portion 31 and the second mirror portion 32 with significantly higher efficiency. Furthermore, since a process proceeds simultaneously in the effective area 101 at a portion corresponding to an arbitrary substrate 11 within the substrate layer 110 and portions corresponding to the surrounding substrates around the substrate 11, such as the etching of the intermediate layer 230 simultaneously performed on the plurality of two-dimensionally arranged portions 50 expected to be removed, it is possible to reduce an unevenness of in-plane stress in the substrate layer 110. Therefore, according to the method for manufacturing the wafer 100, it is possible to obtain the wafer 100 capable of performing stable mass-production of high-quality Fabry-Perot interference filters 1.

Furthermore, application of the laser light L to form the modified region 7 inside the substrate layer 110 along each of the lines 5 and thereby cutting the wafer 100 along each of the lines 5 will be extremely effective in manufacturing the Fabry-Perot interference filter 1 for the following reasons. That is, cutting the wafer 100 using the laser light L needs no water and thus can suppress an incidence of damage onto the second mirror portion 32 floating on the gap S by water pressure and suppress sticking (phenomenon of stoppage of the second mirror portion 32 due to contact with the first mirror portion 31) caused by water intrusion into the gap S. Therefore, cutting the wafer 100 using the laser light L is extremely effective in manufacturing the Fabry-Perot interference filter 1.

[Modifications]

Although an embodiment of the present disclosure has been described as above, the present disclosure is not limited to the embodiment described above. For example, the material and the shape of each configuration are not limited to the materials and the shapes described above, and it is possible to employ various materials and shapes.

Furthermore, as illustrated in FIG. 14, the wafer 100 may include the modified region 7 formed inside the substrate layer 110 so as to correspond to the first groove 290. Here, forming the modified region 7 so as to correspond to the first groove 290 means that the modified region 7 is formed to overlap the first groove 290 when viewed in the facing direction, and in particular, means the modified region 7 is formed along each of the lines 5. This enables the cracks to be extended from the modified region 7 in a thickness direction of the substrate layer 110, making it possible to easily and accurately cut out a plurality of Fabry-Perot interference filters 1 from the wafer 100. In this case, the expanding tape 60 may be attached to the second surface 110b side of the substrate layer 110. At this time, the outer edge portion of the expanding tape 60 attached to the wafer 100 is held by an annular frame. This facilitates handling of the wafer 100 even in a state where the modified region 7 is formed inside the substrate layer 110. In the wafer 100 in which the modified region 7 is formed inside the substrate layer 110, there is a possibility that a crack would unexpectedly extend from the modified region 7. In the wafer 100, the plurality of dummy filter portions 2A, the first groove 290, and the second groove 470 are not provided in the pair of areas 102a of the dummy area 102. Accordingly, the extension of the crack will be stopped by the pair of areas 102a.

Furthermore, the step of detecting the foreign substance F and the step of blowing the air in which the airflow peak position is adjusted on the basis of the detected position of the foreign substance F may be performed either by the operation control of the inspection device 500 (computer control) as in the above embodiment or manually. For example, the step of detecting the foreign substance F may be performed by an operator's visual check for the foreign substance F adhering to the surface 24a of the second laminate 24. Furthermore, the step of blowing air may be performed by an operator manually operating a handgun type air blow gun to perform the air blow.

Furthermore, although the light detection device 10A according to the second embodiment includes the support body 93 having the first substrate 93a, the second substrate 93b, the third substrate 93c, the fourth substrate 93d, and the fifth substrate 93e formed separately from each other, the number of layers of the substrate constituting the support body 93 (here, five layers as an example) may be less than five layers or more than five layers. Furthermore, the support body 93 may be an integrally formed member. That is, the first substrate 93a, the second substrate 93b, the third substrate 93c, the fourth substrate 93d, and the fifth substrate 93e may be integrally formed. In this case, in the manufacturing process of the light detection device 10A, the above-described support layer 930 would be replaced with a support layer having the above-described first substrate layer 930a, second substrate layer 930b, third substrate layer 930c, fourth substrate layer 930d, and fifth substrate layer 930e integrally formed.

In the method for manufacturing a light detection device according to the above-described second embodiment, a lid substrate layer with no formation of the plurality of openings 94c may be used. In this case, after cutting the lid substrate layer and the support layer 930, a light detection device including a lid substrate with no formation of the openings 94c is obtained. Thereafter, by forming the opening 94c in the lid substrate of the light detection device thus obtained, the above-described light detection device 10A will be obtained. In addition, a manufacturer of the light detection device including the lid substrate with no formation of the openings 94c may be the same as or different from a provider that forms the opening 94c in the lid substrate. For example, it is possible to ship a light detection device manufactured using a lid substrate layer with no formation of the plurality of openings 94c (that is, a light detection device having no opening 94c formed in the lid substrate) and then form the openings 94c in the lid substrate of the light detection device at a shipment destination.

Part of the configuration in one embodiment or the modification described above can be flexibly applied to the configuration in another embodiment or the modification.

REFERENCE SIGNS LIST

1: Fabry-Perot interference filter, 1A: Fabry-Perot interference filter portion, 10, 10A: light detection device, 11: substrate, 11a: first surface, 11b: second surface, 22: first laminate, 24: second laminate, 24a: surface, 24b: through-hole, 31: first mirror portion, 32: second mirror portion, 71: package, 71a, 94c: opening, 72: stein, 73: cap, 77, 91: light detector, 92: SMD package (package), 93: support body, 94: lid substrate, 94c: opening, 100: wafer, 930: support layer, 940: lid substrate layer, F: foreign substance, S: gap.

The invention claimed is:

1. A method for removing a foreign substance comprising:
a step of preparing a Fabry-Perot interference filter including a substrate having a first surface and a second surface opposite to the first surface, a first laminate having a first mirror portion arranged on the first surface, and a second laminate having a second mirror portion arranged on the first mirror portion, in which a gap is formed between a portion of the first laminate at least including the first mirror portion and a portion of the second laminate at least including the second mirror portion facing each other so that a distance between the first mirror portion and the second mirror portion facing each other varies by an electrostatic force;
a step of detecting a foreign substance adhering to a surface of the second laminate opposite to the first laminate; and
a step of blowing air in which an airflow peak position is adjusted on the basis of a position of the detected foreign substance onto the surface of the second laminate and thereby removing the foreign substance from the surface of the second laminate.

2. The method for removing the foreign substance according to claim 1,
wherein the airflow peak position is adjusted to match the position of the foreign substance in the step of removing the foreign substance.

3. The method for removing the foreign substance according to claim 1,
wherein a plurality of through-holes is formed from the surface of the second laminate to the gap, in a portion of the second laminate overlapping the gap when viewed in a direction in which the first mirror portion and the second mirror portion face each other, and
the air is blown onto at least a region of the surface of the second laminate where the plurality of through-holes is formed, in the step of removing the foreign substance.

4. The method for removing the foreign substance according to claim 1,
wherein a wafer having a plurality of Fabry-Perot interference filters two-dimensionally linked to each other is prepared in the step of preparing the Fabry-Perot interference filter, and
the step of detecting a foreign substance and the step of removing the foreign substance are performed on the Fabry-Perot interference filter constituting the wafer.

5. The method for removing the foreign substance according to claim 1,
wherein singulated Fabry-Perot interference filters are prepared in the step of preparing the Fabry-Perot interference filter.

6. A method for manufacturing a light detection device including a package having a cap formed with an opening through which light is incident and having a stem joined to the cap, a Fabry-Perot interference filter disposed in the package, and a light detector arranged in the package so as to detect the light transmitted through the Fabry-Perot interference filter,
wherein the Fabry-Perot interference filter includes a substrate having a first surface and a second surface opposite to the first surface, a first laminate having a first mirror portion arranged on the first surface, and a second laminate having a second mirror portion arranged on the first mirror portion, in which a gap is formed between a portion of the first laminate at least including the first mirror portion and a portion of the second laminate at least including the second mirror portion facing each other so that a distance between the first mirror portion and the second mirror portion facing each other varies by an electrostatic force,
the manufacturing method comprising:
a step of preparing the stem to which the Fabry-Perot interference filter and the light detector are secured;
a step of detecting a foreign substance adhering to a surface of the second laminate opposite to the first laminate of the Fabry-Perot interference filter secured to the stem;
a step of blowing air in which an airflow peak position is adjusted on the basis of a position of the detected foreign substance onto the surface of the second laminate and thereby removing the foreign substance from the surface of the second laminate; and
a step of joining the cap to the stem after the step of removing the foreign substance.

7. A method for manufacturing a light detection device including a package having a lid substrate and a support body joined to the lid substrate, a Fabry-Perot interference filter disposed inside the package, and a light detector disposed in the package so as to detect light transmitted through the Fabry-Perot interference filter,
wherein the Fabry-Perot interference filter includes a substrate having a first surface and a second surface opposite to the first surface, a first laminate having a first mirror portion arranged on the first surface, and a second laminate having a second mirror portion arranged on the first mirror portion, in which a gap is formed between a portion of the first laminate at least including the first mirror portion and a portion of the second laminate at least including the second mirror portion facing each other so that a distance between the first mirror portion and the second mirror portion facing each other varies by an electrostatic force,
the manufacturing method comprising:
a step of preparing a plurality of Fabry-Perot interference filters arranged one-dimensionally or two-dimensionally, a plurality of light detectors provided corresponding to the plurality of Fabry-Perot interference filters, and a support layer that supports the plurality of Fabry-Perot interference filters and the plurality of light detectors and that is to be cut into a plurality of support bodies;
a step of detecting a foreign substance adhering to a surface of the second laminate opposite to the first laminate for each of the plurality of Fabry-Perot interference filters;
a step of blowing air in which an airflow peak position is adjusted on the basis of a position of the detected foreign substance onto the surface of the second laminate and thereby removing the foreign substance from the surface of the second laminate;
a step of joining a lid substrate layer that is to be cut into a plurality of lid substrates to the support layer after the step of removing the foreign substance and thereby obtaining a plurality of light detection devices one-dimensionally or two-dimensionally linked to each other; and
a step of cutting a portion at which the lid substrate layer and the support layer are joined and thereby obtaining each of the light detection devices.

8. The method for manufacturing the light detection device according to claim 7,
wherein in the step of obtaining the plurality of light detection devices, the lid substrate layer having a plurality of openings formed in advance is joined to the support layer such that each of the plurality of openings faces each of the plurality of Fabry-Perot interference filters.

* * * * *